(12) United States Patent  (10) Patent No.: US 7,977,669 B2
Yukawa et al.  (45) Date of Patent: Jul. 12, 2011

(54) SEMICONDUCTOR MEMORY DEVICE HAVING A LIQUID-REPELLENT LAYER

(75) Inventors: Mikio Yukawa, Atsugi (JP); Gen Fujii, Sagamihara (JP); Hironobu Shoji, Machida (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 675 days.

(21) Appl. No.: 11/884,016

(22) PCT Filed: Feb. 7, 2006

(86) PCT No.: PCT/JP2006/302417
§ 371 (c)(1),
(2), (4) Date: Aug. 9, 2007

(87) PCT Pub. No.: WO2006/085634
PCT Pub. Date: Aug. 17, 2006

(65) Prior Publication Data
US 2008/0099878 A1  May 1, 2008

(30) Foreign Application Priority Data
Feb. 10, 2005 (JP) ................................. 2005-035266

(51) Int. Cl.
  *H01L 35/24* (2006.01)
  *H01L 51/00* (2006.01)
  *H01L 47/00* (2006.01)
(52) U.S. Cl. ........ 257/40; 257/3; 257/632; 257/E45.002
(58) Field of Classification Search .................... 257/40, 257/3–5, 632, 679, E45.002
See application file for complete search history.

(56) References Cited

U.S. PATENT DOCUMENTS

| 4,409,604 | A | 10/1983 | Forland |
| 5,166,556 | A | 11/1992 | Hsu et al. |
| 5,206,665 | A | 4/1993 | Kawade et al. |
| 5,389,475 | A | 2/1995 | Yanagisawa et al. |
| 5,502,326 | A | 3/1996 | Slotboom et al. |
| 5,579,135 | A | 11/1996 | Kajiyama et al. |
| 5,759,876 | A | 6/1998 | Singlevich et al. |

(Continued)

FOREIGN PATENT DOCUMENTS

EP  0 224 418  6/1987

(Continued)

OTHER PUBLICATIONS

International Search Report (Application No. PCT/JP2006/302417) dated May 16, 2006.

(Continued)

*Primary Examiner* — Shouxiang Hu
(74) *Attorney, Agent, or Firm* — Eric J. Robinson; Robinson Intellectual Property Law Office, P.C.

(57) ABSTRACT

It is an object of the present invention to provide a high-performance and high reliable semiconductor device and to provide a technique of manufacturing the semiconductor device at low cost with high yield. The semiconductor device is manufactured by steps of forming a first conductive layer, forming a first liquid-repellent layer over the first conductive layer, discharging a composition containing a material for a mask layer over the first liquid-repellent layer to form a mask layer, processing the first liquid-repellent layer with the use of the mask layer, forming a second liquid-repellent layer, forming an insulating layer over the first conductive layer and the second conductive layer, and forming a second conductive layer over the insulating layer.

13 Claims, 21 Drawing Sheets

U.S. PATENT DOCUMENTS

| | | | |
|---|---|---|---|
| 5,883,397 A | 3/1999 | Isoda et al. | |
| 6,144,074 A | 11/2000 | Akita | |
| 6,319,315 B1 * | 11/2001 | Sanjoh | 117/206 |
| 6,528,815 B1 | 3/2003 | Brown et al. | |
| 6,723,396 B1 | 4/2004 | Patrick | |
| 6,768,157 B2 | 7/2004 | Krieger et al. | |
| 6,809,952 B2 | 10/2004 | Masui | |
| 6,828,685 B2 | 12/2004 | Stasiak | |
| 6,858,270 B2 | 2/2005 | Patrick | |
| 6,864,123 B2 | 3/2005 | Shimoda | |
| 6,903,397 B2 * | 6/2005 | Asakawa | 257/295 |
| 6,947,321 B2 | 9/2005 | Tanabe | |
| 6,950,331 B2 * | 9/2005 | Yang et al. | 365/148 |
| 7,211,502 B2 | 5/2007 | Yamazaki et al. | |
| 2001/0039124 A1 | 11/2001 | Shimoda | |
| 2004/0057323 A1 * | 3/2004 | Tanabe | 365/232 |
| 2006/0263634 A1 * | 11/2006 | Yamazaki | 428/690 |
| 2008/0087982 A1 * | 4/2008 | Fujii | 257/530 |

FOREIGN PATENT DOCUMENTS

| | | |
|---|---|---|
| JP | 07-022669 | 1/1995 |
| JP | 2001-274344 | 10/2001 |
| WO | WO 97/16851 | 5/1997 |

OTHER PUBLICATIONS

Written Opinion (Application No. PCT/JP2006/302417) dated May 16, 2006.

* cited by examiner

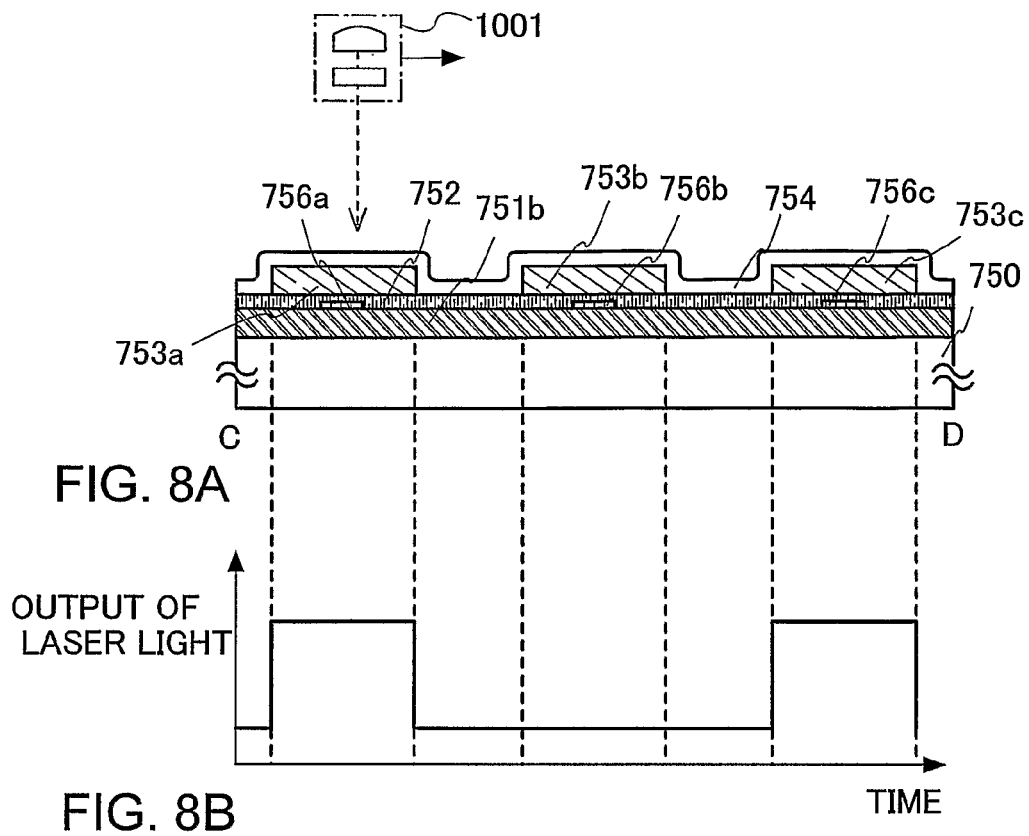
FIG. 8A
FIG. 8B
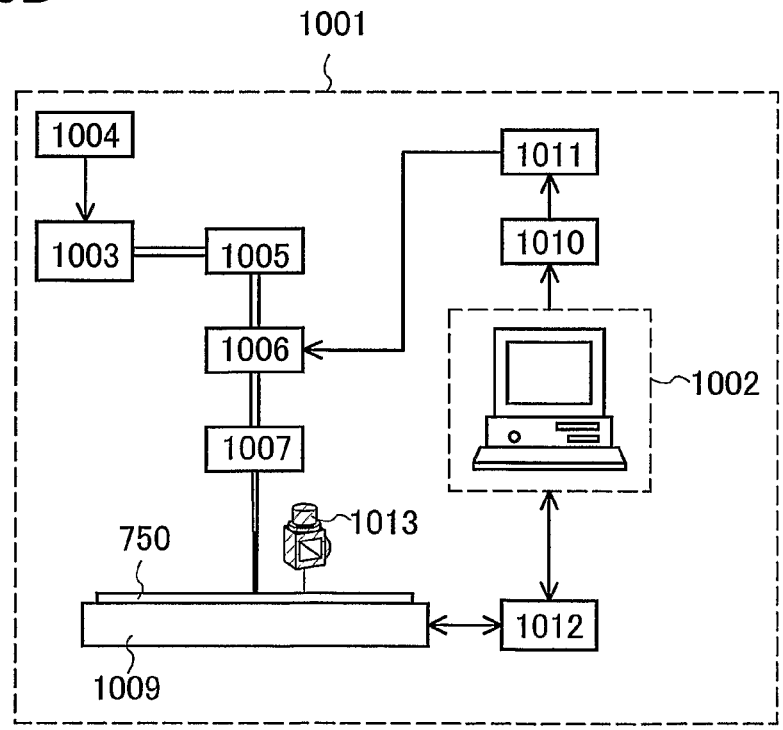
FIG. 8C

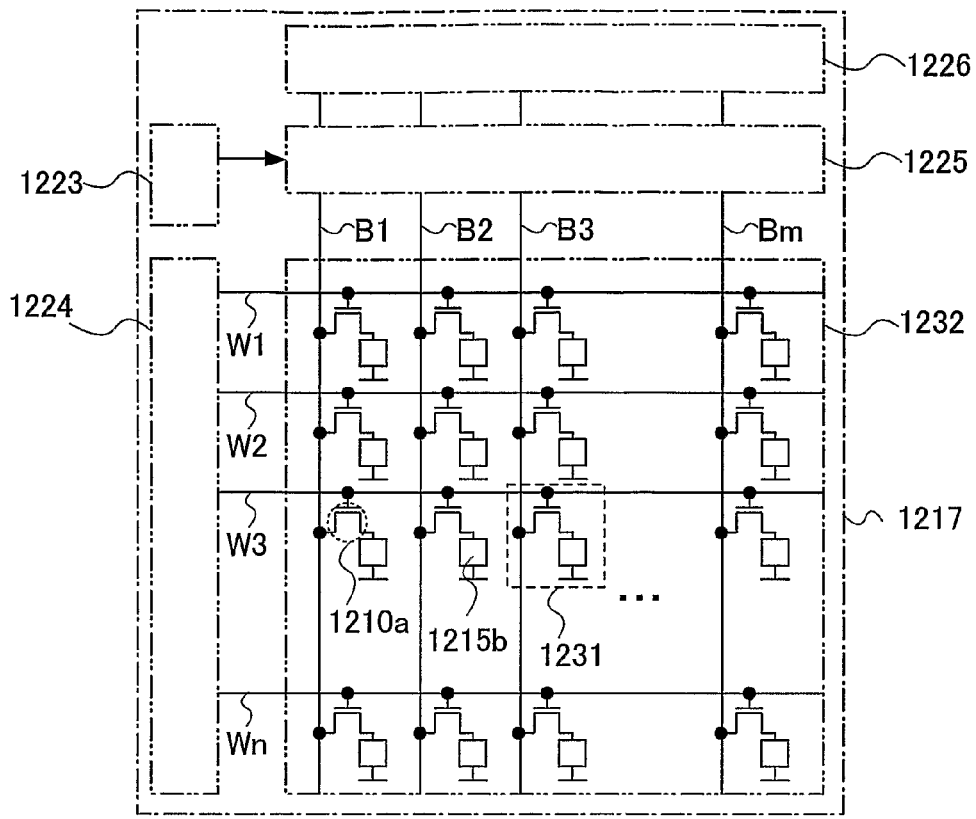
FIG. 21A
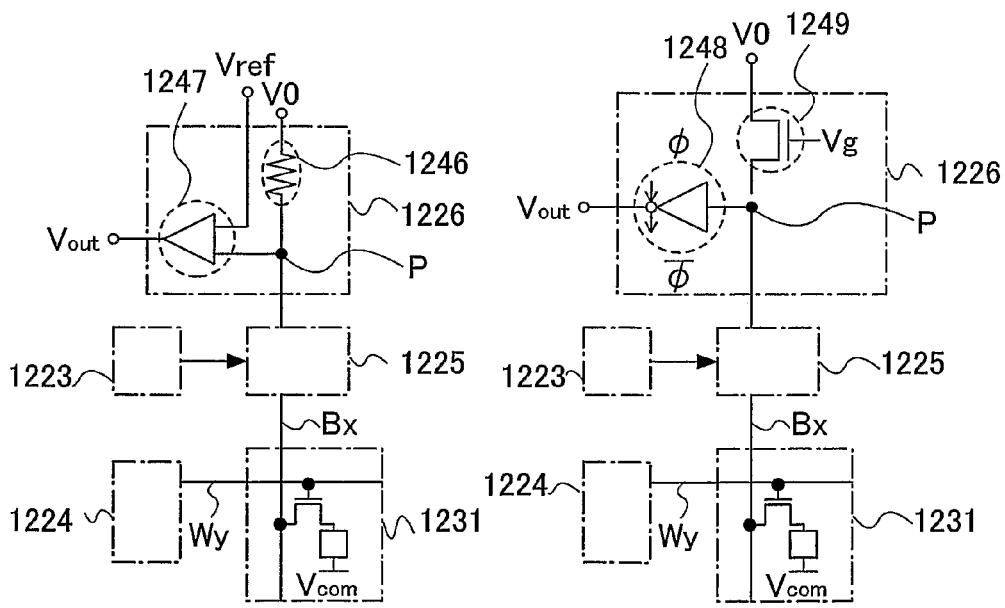
FIG. 21B
FIG. 21C

SEMICONDUCTOR MEMORY DEVICE HAVING A LIQUID-REPELLENT LAYER

TECHNICAL FIELD

The present invention relates to a semiconductor device and a manufacturing method of the semiconductor device.

BACKGROUND ART

In recent years, individual recognition technology has attracted attention. For example, there is technology to be used for production and management, in which information such as a history of the object is clarified by giving an ID (an individual recognition code) to an individual object. Above all, the developments of semiconductor devices capable of non-contact transmitting and receiving data have been advanced. As such semiconductor devices, particularly, an RFID (Radio Frequency Identification) (also referred to as an ID tag, an IC tag, and IC chip, an RF (Radio Frequency) tag, a wireless tag, an electronic tag, or a wireless chip) has been beginning to be introduced into companies, markets, and the like.

Many of the semiconductor devices have a circuit using a semiconductor substrate such as a silicon (Si) substrate (hereinafter, also referred to as an IC (Integrated Circuit) chip) and an antenna, and the IC chip includes a memory circuit (hereinafter, also referred to as a memory), a control circuit, and the like. Further, organic thin film transistors (hereinafter, also referred to as a TFT) or organic memories using organic compounds for the control circuits and memory circuits have been actively developed (for example, Patent Document 1).
Patent Document 1: Japanese Patent Application Laid-open No. Hei. 7-22669

DISCLOSURE OF INVENTION

However, in the case of a memory circuit using an organic compound that is provided between a pair of electrodes to form a memory element, there is a problem that current is difficult to flow and driving voltage rises depending on a film thickness of an organic compound layer and a size of the memory circuit.

Therefore, it is an object of the present invention to provide a technique in which a high-performance and highly reliable semiconductor device can be manufactured at low cost with high yield.

A substance including an insulating material becomes to have fluidity when a temperature rises to the glass-transition temperature of the material. Therefore, an insulating layer formed of the substance including the insulating material becomes a composition, which has fluidity and keeps an unstable shape, at equal to or higher than the glass-transition temperature, and behaves like a liquid state. When the insulating layer has fluidity, wettability of a surface of the formation region, which is not affected much in a solid state, comes to affect on its shape so that the wettability greatly relates to a flowing direction, speed and the like of the composition.

Wettability of a surface of a solid that is a formation substance is affected by a chemical property of the surface. In the case of a substance having low wettability with respect to a composition having fluidity, a surface of the substance becomes a region having low wettability (hereinafter, also referred to as a low wettability region) with respect to the composition having fluidity. On the other hand, in the case of a substance having high wettability with respect to the composition having fluidity, a surface of the substance becomes a region having high wettability (hereinafter, also referred to as a high wettability region) with respect to the composition having fluidity. In the present invention, when the temperature rises to equal to or higher than the glass-transition temperature after applying voltage in an insulating layer and the insulating layer changes into a composition having fluidity, wettability of the surface of the formation region is controlled by a material and a processing treatment so that the composition is formed in a region having different wettability.

The region having different wettability has a difference in wettability with respect to the composition having fluidity and a different contact angle of the composition having fluidity. A region having a large contact angle of the composition having fluidity is a region having lower wettability (hereinafter, also referred to as a low wettability region), whereas a region having a small contact angle is a region having higher wettability (hereinafter, also referred to as a high wettability region). When the contact angle is large, the composition having fluidity does not spread over a surface of the region and is repelled by the surface; therefore, the surface is not wetted. Alternatively, when the contact angle is small, the composition having fluidity spreads over the surface; therefore, the surface is more wetted. Accordingly, the region having different wettability has different surface energy. A surface of the region having low wettability has low surface energy, and a surface of the region having high wettability has high surface energy.

In the present invention, an insulating layer, also referred to as a memory layer, forming a memory element that is included in a semiconductor device is formed over a first conductive layer. When voltage is applied between the first conductive layer and a second conductive layer, current also flows through the insulating layer and heat is generated. Then, when a temperature of the insulating layer rises to the glass-transition temperature, a material forming the insulating layer becomes a composition having fluidity. A surface of the first conductive layer is controlled to have regions having different wettability with respect to the composition having fluidity over a surface of the first conductive layer. Specifically, a region having low-wettability liquid repellency with respect to the composition having fluidity is selectively formed over the surface of the first conductive layer to form two kinds of regions (a high wettability region and a low wettability region) having different wettability. Since the composition having fluidity transfers toward a region that have higher wettability, the composition having fluidity flows to a high wettability region without keeping a solid state shape. Therefore, a film thickness of the insulating layer is uneven, and the insulating layer is transformed to cause short-circuit of the first conductive layer and the second conductive layer. Further, an electric field may concentrate at a region where a film thickness of the insulating layer is thin, and the dielectric breakdown may generate to cause short-circuit of the first conductive layer and the second conductive layer. Therefore, conductivity of the memory element changes before and after applying voltage.

It is to be noted that in a memory layer, which is referred to as an insulating layer and included in a memory element in the present specification, a small amount of current flows through when the material of the memory layer is in a thin film state, whereas in a bulk state, an insulating property is exhibited.

The differences in wettability is relative to the relationship of the regions. Two kinds of regions in which each wettability is different can be formed by selectively forming a low wettability region over a layer having a rough surface. As a method for selectively forming the low wettability region, a method for selectively forming a low wettability material by forming and using a mask layer, a method for performing surface treatment to selectively lower wettability by using a mask layer, or the like can be used. Alternatively, a method for selectively eliminating a low wettability effect (removal or decomposition of a substance having low wettability) after forming a low wettability region, or the like can also be used.

As a method for changing and controlling wettability of a surface, there is a method for changing wettability by decomposing a substance of the surface and modifying a region surface by light irradiation energy. As a substance having low wettability, a substance containing a fluorocarbon chain or a substance containing a silane coupling agent can be used. The silane coupling agent can form a monomolecular film; therefore, it can perform decomposition and modification efficiently and change wettability for a short time. The monomolecular film can be referred to as a self-assembled film. In addition, not only a silane coupling agent having a fluorocarbon chain but also that having an alkyl group can be used, because the silane coupling agent having an alkyl group exhibits low wettability when arranged over a substrate. Since the silane coupling agent has a different effect that lowers the wettability depending on whether a containing functional group is a fluorocarbon group or an alkyl group, a material of the silane coupling agent can be appropriately determined so that necessary wettability can be obtained. Further, as the substance having low wettability, a titanate coupling agent or an aluminate coupling agent may also be used.

It is to be noted that a semiconductor device in the present specification indicates a device that can operate by utilizing semiconductor characteristics. A multilayer wiring layer or a semiconductor device such as a processor chip can be manufactured by using the present invention.

An aspect of a semiconductor device according to the present invention has a memory element including a first conductive layer, a liquid-repellent layer over a part of the first conductive layer, an insulating layer over the first conductive layer and the liquid-repellent layer, and a second conductive layer over the insulating layer.

Another aspect of the semiconductor device according to the present invention has a memory element including a first conductive layer, a liquid-repellent layer overlapping with an inside of the periphery in the first conductive layer, an insulating layer over the first conductive layer and the liquid-repellent layer, and a second conductive layer over the insulating layer.

Another aspect of the semiconductor device according to the present invention has a memory element including a first conductive layer, a monomolecular film over a part of the first conductive layer, an insulating layer over the first conductive layer and the monomolecular film, and a second conductive layer over the insulating layer.

Another aspect of the semiconductor device according to the present invention has a memory element including a first conductive layer, a monomolecular film overlapping with an inside of the periphery in the first conductive layer, an insulating layer over the first conductive layer and the monomolecular film, and a second conductive layer over the insulating layer.

An aspect of a method for manufacturing a semiconductor device according to the present invention is to form a memory element by the steps of: forming a first conductive layer, selectively forming a liquid-repellent layer over the first conductive layer, forming an insulating layer over the first conductive layer and the liquid-repellent layer, and forming a second conductive layer over the insulating layer.

Another aspect of the method for manufacturing the semiconductor device according to the present invention is to form a memory element by the steps of: forming a first conductive layer, forming a first liquid-repellent layer over the first conductive layer, discharging a composition containing a material for a mask layer over the first liquid-repellent layer to form a mask layer, processing the first liquid-repellent layer using the mask layer to form a second liquid-repellent layer, forming an insulating layer over the first conductive layer and the second liquid-repellent layer, and forming a second conductive layer over the insulating layer.

Another aspect of the method for manufacturing the semiconductor device according to the present invention is to form a memory element by the steps of: forming a first conductive layer, selectively forming a monomolecular film over the first conductive layer, forming an insulating layer over the first conductive layer and the monomolecular film, and forming a second conductive layer over the insulating layer.

Another aspect of the method for manufacturing the semiconductor device according to the present invention is to form a memory element by the steps of: forming a first conductive layer, forming a first monomolecular film over the first conductive layer, discharging a composition containing a material for a mask layer over the monomolecular film to form a mask layer, processing the first monomolecular film with the use of the mask layer, forming a second monomolecular film, forming an insulating layer over the first conductive layer and the second monomolecular film to form a second conductive layer over the insulating layer.

In according with the present invention, a high-performance and highly reliable semiconductor device can be manufactured at low cost with high yield.

BRIEF DESCRIPTION OF DRAWINGS

FIGS. 8A to 8C are diagrams describing a memory device according to the present invention;

FIGS. 21A to 21C are diagrams describing a memory device according to the present invention.

BEST MODE FOR CARRYING OUT THE INVENTION

Figure 1A:
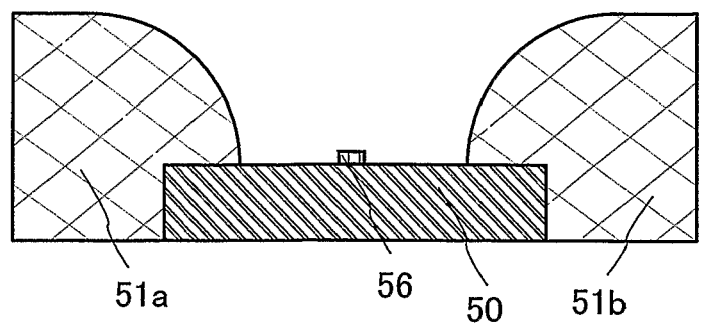
FIGS. 1A to 1C are schematic views describing the present invention.

Embodiment Modes of the present invention will be described with reference to drawings. However, the present invention is not limited to the following description and, it is to be easily understood that various changes and modifications will be apparent to those skilled in the art, unless such changes and modifications depart from the content and the scope of the invention. Therefore, the present invention is not construed as being limited to the description of the following Embodiment Modes. It is to be noted that, in the structure of the present invention, the same portion or a portion having the same function is denoted by the same reference numeral in all drawings for describing Embodiment Modes, and the description thereof is omitted.

Embodiment Mode 1

In the present embodiment mode, an example of a structure of a memory element included in a memory device according to the present invention will be described with drawings. More concretely, a case of a memory device that has a passive matrix structure will be shown.

Figure 1B:
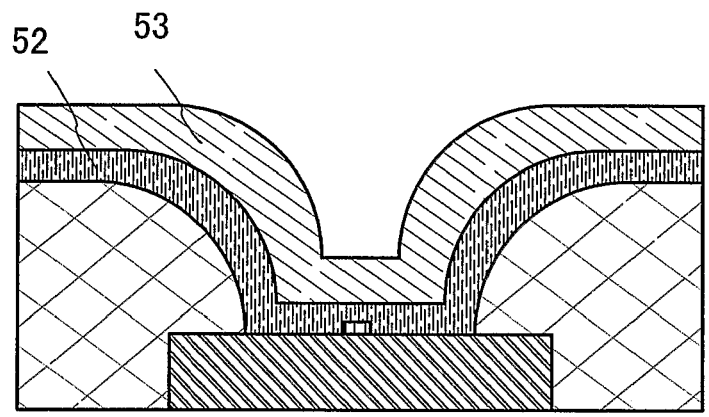
Figure 1C:
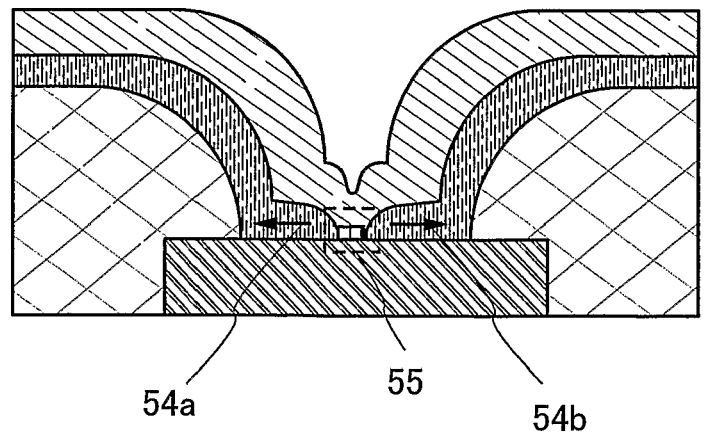

A memory element according to the present invention and an operation mechanism thereof will be described with reference to FIGS. 1A to 1C. In FIGS. 1A to 1C, the memory element has a partition wall (insulating layer) 51a and a partition wall (insulating layer) 51b to cover an end portion of a first conductive layer 50. The partition wall (insulating layer) 51a and the partition wall (insulating layer) 51b also serve as a partition wall that separates the memory elements from other memory elements. In the present embodiment mode, a liquid-repellent layer 56 is formed over the first conductive layer 50 in order to form a region having different wettability with respect to the composition when an insulating layer 52 becomes a composition having fluidity at the glass-transition temperature. The liquid-repellent layer 56 has low wettability with respect to the composition having fluidity, which is a material forming the insulating layer 52. Therefore, the liquid-repellent layer 56 over the first conductive layer is relatively a low wettability region compared to a peripheral surface of the first conductive layer. Accordingly, the peripheral surface of the first conductive layer where the liquid-repellent layer 56 is not formed becomes to a high wettability region. The insulating layer 52 is formed over the partition wall (insulating layer) 51a, the partition wall (insulating layer) 51b, the first conductive layer 50, and the liquid-repellent layer 56, and then, a second conductive layer 53 is formed over the insulating layer 52.

As a material for the first conductive layer 50 and the second conductive layer 53, an element or a compound that has high conductivity, or like is used. In the present embodiment mode, as a material for the insulating layer 52, a substance that changes in the crystalline state, conductivity, and the shape by electric action or optical action is used. Since a memory element having the structure described above has conductivity that changes before and after applying voltage, the memory element can memorize two values corresponding to "initial state" and "after change of conductivity". The change in conductivity of the memory element before and after applying voltage will be described.

A substance including an insulating material that forms an insulating layer has fluidity when a temperature rises to the glass-transition temperature of the material. Therefore, the insulating layer becomes a composition that has fluidity and does not maintain a constant shape at equal to or higher than the glass-transition temperature, and behaves like a liquid state. When the insulating layer becomes to have fluidity, wettability of a surface of a formation region, which is not highly influenced in a solid state, comes to affect on its shape. In addition, the wettability greatly relates to a flowing direction, speed and the like of the composition.

The wettability of a surface of a solid that is a formation substance is affected by chemical property of the surface. In the case of a substance having low wettability with respect to a composition having fluidity, a surface thereof becomes a region having low wettability with respect to the composition having fluidity. On the other hand, in the case of a substance having high wettability with respect to the composition having fluidity, a surface thereof becomes a region having high wettability with respect to the composition having fluidity. In the present invention, when a temperature rises to equal to or higher than the glass-transition temperature after applying voltage in an insulating layer and the insulating layer changes into a composition having fluidity, wettability of the surface of the formation region is controlled by a material or a processing treatment so that the composition is formed in regions having different wettability. Specifically, a region having different wettability with respect to the composition having fluidity is formed over the first conductive layer.

A region having a different wettability has difference in wettability with respect to a composition having fluidity and a different contact angle of a composition having fluidity. A region having a large contact angle of the composition having fluidity is a region having low wettability, whereas a region having a small contact angle is a region having high wettability. When the contact angle is large, the composition having fluidity does not spread over a surface of the region and is repelled by the surface; therefore, the surface is not wetted. However, when the contact angle is small, the composition having fluidity spreads over the surface; therefore, the surface is more wetted. Accordingly, each of the regions having different wettability has different surface energy. A surface of a region having low wettability has low surface energy, and a surface of a region having high wettability has high surface energy.

In the present embodiment mode, the insulating layer 52 forming a memory element that is included in a memory device is formed over the first conductive layer 50. When voltage is applied between the first conductive layer 50 and the second conductive layer 53, current also flows through the insulating layer 52 and heat is generated. Then, when a temperature of the insulating layer rises to the glass-transition temperature, a material forming the insulating layer 52 becomes a composition having fluidity. The surface of the first conductive layer 50 is controlled to have a region having different wettability with respect to the composition having fluidity by forming the liquid-repellent layer 56, and has two kinds of regions (high wettability region and low wettability region) having different wettability.

Since the composition having fluidity transfers toward a region that have high wettability, the composition having fluidity flows to the peripheral high wettability regions that are shown by directions of an arrow 54a and an arrow 54b without maintaining a shape of a solid state shape and staying in the low wettability surface of the liquid-repellent layer. Therefore, a film thickness of the insulating layer becomes uneven, and the insulating layer is transformed to contact the first conductive layer 50 to the second conductive layer 53 as shown in a region 55 in FIG. 1C. Accordingly, the first conductive layer 50 and the second conductive layer 53 are short-circuited. Further, an electric field may concentrate at a region where a film thickness of the insulating layer is thin, and the dielectric breakdown may generate to cause short-circuit of the first conductive layer and the second conductive layer. Therefore, conductivity of the memory element changes before and after applying voltage. Further, as in the present embodiment mode, it is preferable that when a material forming the partition walls (insulating layers) 51a and 51b have high wettability with respect to the composition having fluidity, the composition transfers more easily since the composition having fluidity is strongly pulled towards the partition walls (insulating layers) 51a and 51b.

Accordingly, writing with low power consumption can be performed.

A difference of the contact angle between the high wettability region and the low wettability region over the surface of the first conductive layer 50 with respect to the composition in which the insulating material is fluidized is preferably 30 degree or more, and, more preferably, 40 degree or more.

The difference in wettability is relative relation between the regions. Two kinds of regions in which each wettability is different can be formed by selectively forming a low wettability region over a layer having a rough surface. As a method for selectively forming the low wettability region, a method for selectively forming a low wettability substance by forming and using a mask layer, a method for performing surface treatment to lower wettability selectively by using a mask layer, or the like can be used. Alternatively, a method for selectively eliminating a low wettability effect (removal or decomposition of a substance having low wettability) after forming a low wettability region, or the like can also be used.

As a method for changing and controlling wettability of the surface, there is a method for changing wettability by decomposing a surface substance and modifying a region surface with the use of light irradiation energy. As the substance having low wettability, a substance containing a fluorocarbon chain or a substance containing a silane coupling agent can be used. The silane coupling agent can form a monomolecular film; therefore, it can perform decomposition and modification efficiently and change wettability in a short time. The monomolecular film can be referred to as a self-assembled film. In addition, not only a silane coupling agent having a fluorocarbon chain but also that having an alkyl group can be used, because the silane coupling agent having an alkyl group exhibits low wettability when arranged over a substrate.

Figure 3:
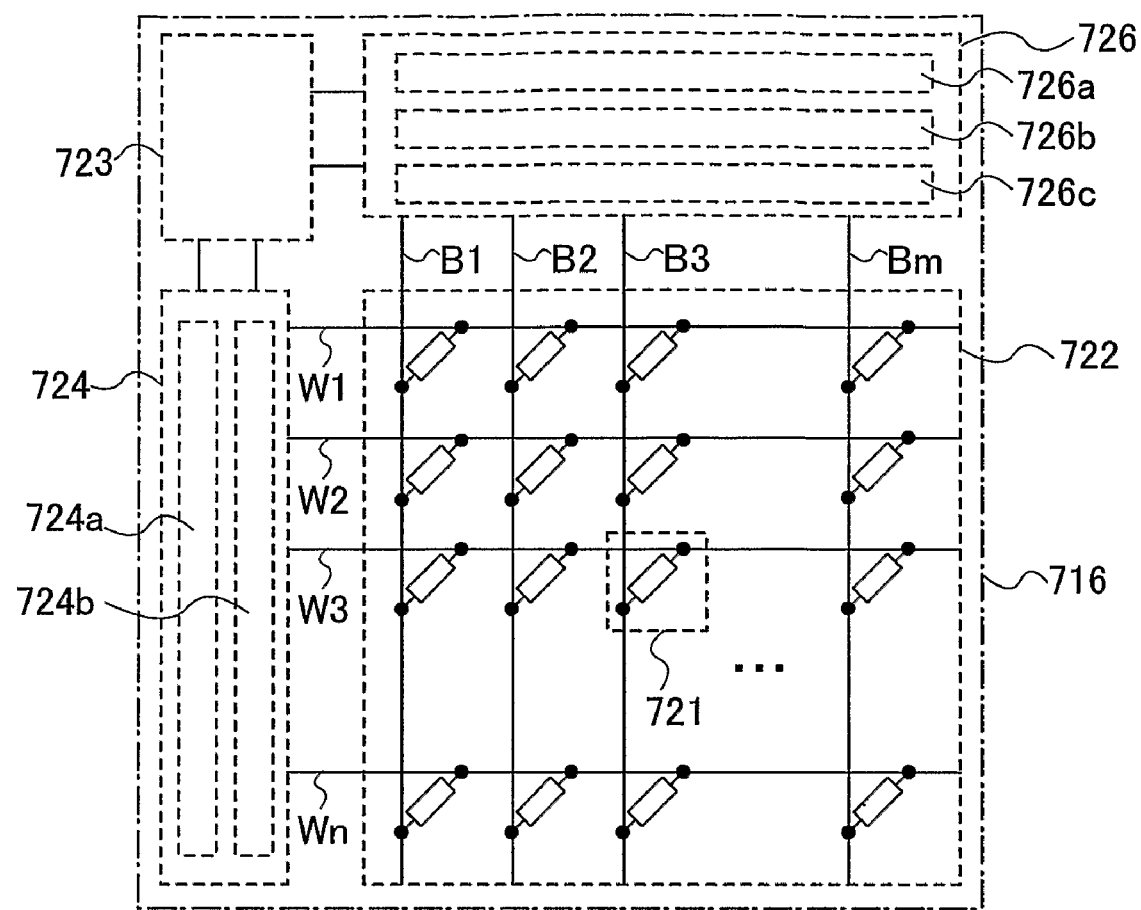
FIG. 3 is a diagram describing a memory device according to the present invention.

FIG. 3 shows an example of a structure of a memory device according to the present invention. The memory device includes a memory cell array 722 provided with memory cells 721 in a matrix; a bit line driving circuit 726 having a column decoder 726a, a reading circuit 726b, and a selector 726c; a word line driving circuit 724 having a low decoder 724a and a level shifter 724b; and an interface 723 having a writing circuit and communicating with outside. It is to be noted that a structure of a memory device 716 shown here is only one example. The memory device 716 may include a sense amplifier, an output circuit, a buffer, and the like, and the writing circuit may be provided in the bit line driving circuit.

The memory cell 721 includes a first conductive layer forming a word line Wy ($1 \leq y \leq n$), a second conductive layer forming a bit line Bx ($1 \leq x \leq m$), and an insulting layer. The insulating layer is provided by a single layer or a stacked layer between the first conductive layer and the second conductive layer.

Figure 2A:
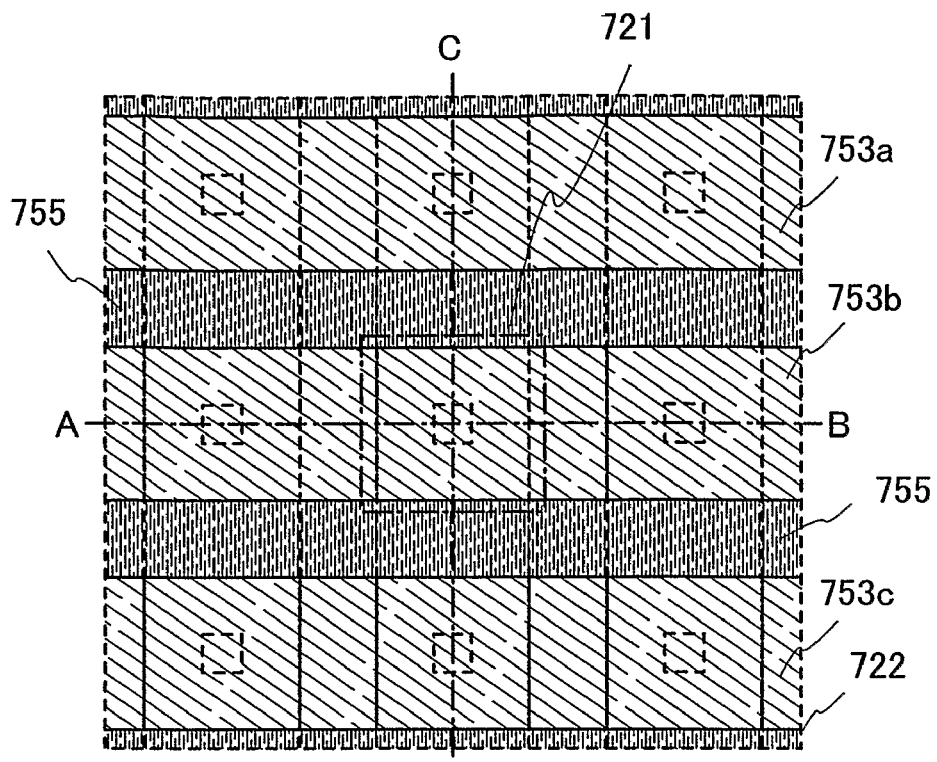
FIGS. 2A to 2C are views describing a memory device according to the present invention.
Figure 2B:
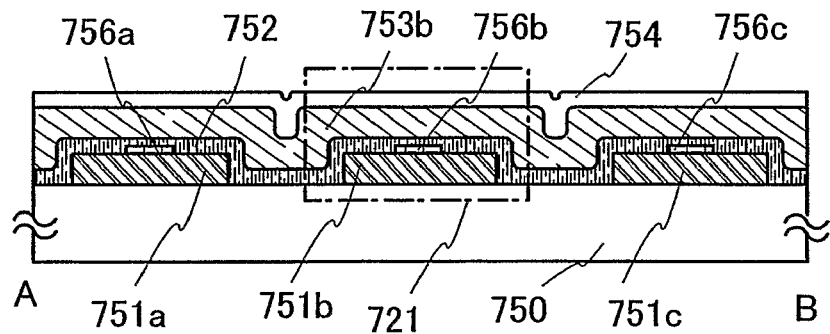
Figure 2C:
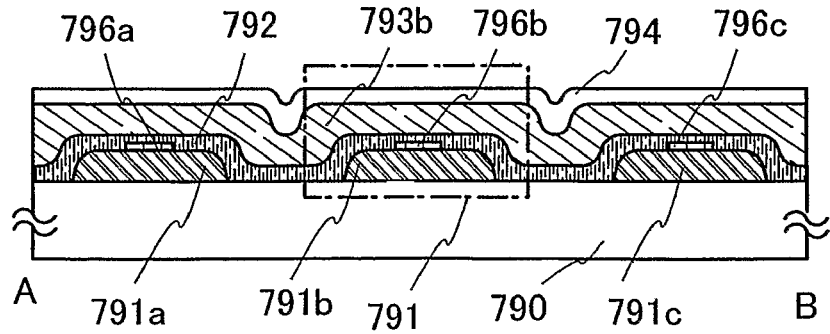

FIG. 2A shows a top view of the memory cell array 722, FIGS. 2B and 2C show cross-sectional views taken along line A-B in FIG. 2A. In FIG. 2A, an insulating layer 752 and an insulating layer 754 are omitted, however, each of the insulating layers 752 and 754 is provided as shown in FIG. 2B.

The memory cell array 722 includes a first conductive layer 751a, a first conductive layer 751b, and a first conductive layer 751c, which extend in a first direction, and a partition wall (insulating layer) 755; the insulating layer 752 that is provide to cover the first conductive layers 751a and 751b, the first conductive layer 751c, and the partition wall (insulating layer) 755; and a second conductive layer 752a, a second conductive layer 753b, and a second conductive layer 753c, which extend in a second direction being perpendicular to the first direction (see FIGS. 2A and 2B). The insulating layer 752 is provided between the first conductive layers 751a, 751b, and 751c, and the second conductive layers 753a, 753b, and 753c. Further, the insulating layer 754 serving as a protective film is provided to cover the second conductive layers 753a, 753b, and 753c (see FIG. 2B). Liquid-repellent layers 756a, 756b, and 756c are respectively formed over the first conductive layers 751a, 751b, and 751c so that surfaces of the first conductive layers 751a, 751b, and 751c are controlled to have regions having different wettability. When influence of an electric field in lateral directions between each adjacent memory cell is concerned, the insulating layer 752 that is provided in each memory cell may be isolated.

FIG. 2C is a modified example of FIG. 2B. Reference numeral 791 is a memory cell. Over a substrate 790, a first conductive layer 791a, a first conductive layer 791b, a first conductive layer 791c, an insulating layer 792, a second conductive layer 793b, and an insulating layer 794 that is a protective film are formed. Liquid-repellent layers 796a, 796b, and 796c are respectively formed over the first conductive layer 791a, the first conductive layer 791b, and the first conductive layer 791c. Surfaces of the first conductive layers 791a, 791b, and 791c are controlled to have regions having different wettability. A shape of first conductive layers may have a taper shape or a shape in which a radius of curvature is varied continuously similar to the first conductive layers 791a, 791b, and 791c in FIG. 2C. A shape such as the first conductive layers 791a, 791b, and 791c can be formed with the use of a droplet discharging method or the like. A curved surface having such a curvature provides favorable coverage of stacked insulating layers or conductive layers.

Figure 15A:
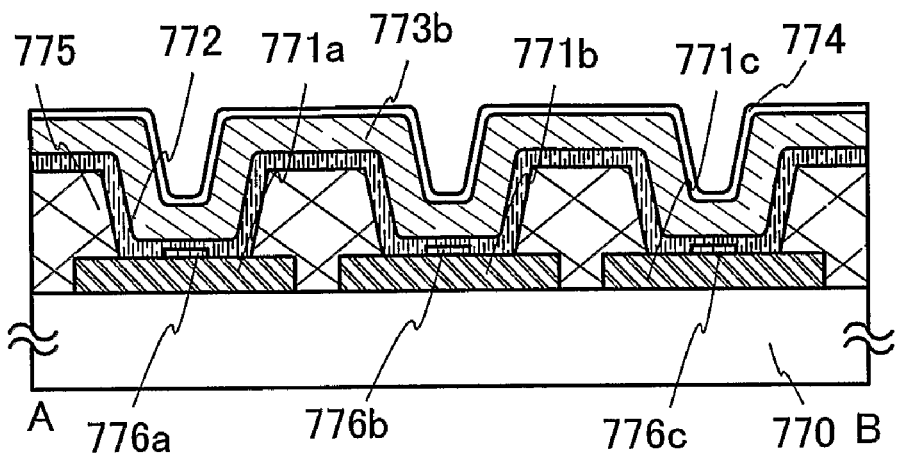
FIGS. 15A and 15B are views describing a memory device according to the present invention.
Figure 15B:
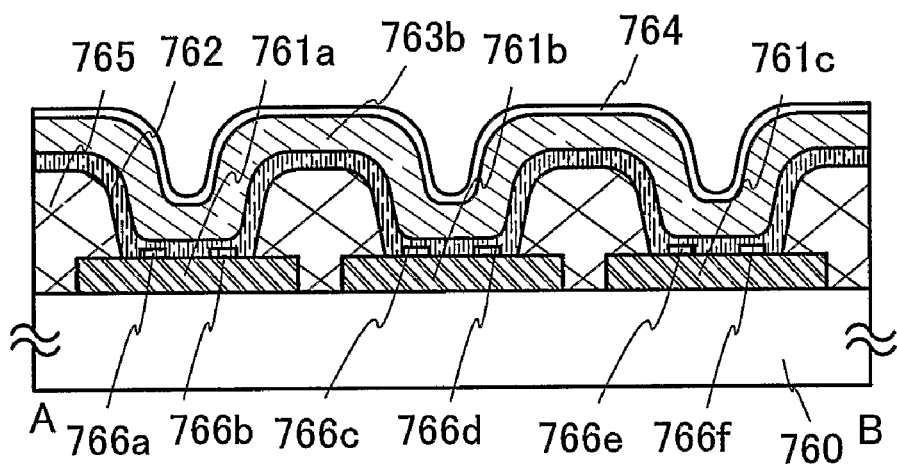

As described above, when the partition wall (insulating layer) is formed and the partition wall (insulating layer) has high wettability with respect to the composition having fluidity, it is preferable that the composition having fluidity is strongly pulled towards the partition wall and more easily transferred. FIGS. 15A and 15B show a structure in which ends of first conductive layers are covered with a partition wall (insulating layer).

FIG. 15A shows an example of forming liquid-repellent layers 776a, 776b, and 776c, which are respectively formed of a low wettability substance, over first conductive layers 771a, 771b, and 771c. In the present embodiment mode, a partition wall (insulating layer) 775 is formed in a shape having a taper to cover ends of the first conductive layers 771a, 771b, and 771c. An insulating layer 772, a second conductive layer 773b, and a partition wall (insulating layer) 774 are formed by a dry process such as an evaporation method over the first conductive layers 771a, 771b, and 771c and the liquid-repellent layers 776a, 776b, and 776c, which are provided over a substrate 770. A memory device as shown in FIG. 15B has a partition wall (insulating layer) 765 that has a curvature, a radius of which is varied continuously. Liquid-repellent layers 766a and 766b; 766c and 766d; and 766e and 766f are respectively formed over first conductive layers 761a, 761b, and 761c, in which two liquid-repellent layers are provided for one conductive layer. An insulating layer 762, a second conductive layer 763b, and an insulating layer 764 are formed over the first conductive layers 761a, 761b, and 761c, and the liquid-repellent layers 766a, 766b, 766c, 766d, 766e, and 766f, which are provided over a substrate 760. As described above, a plurality of liquid-repellent layers may be formed over the first conductive layer, and the surface of the first conductive layer may be controlled to have a region having different wettability. Therefore, a shape and a size of the liquid-repellent layers may be determined depending on a size or required characteristics of the memory element. Further, the liquid-repellent layer may be a thin film in which a film thickness is several nanometers, and is not required to have continuity as a film due to the forming method.

In the present specification, the liquid-repellent layer indicates a film having a property that shows liquid repellency (repelling a fluidized substance) with respect to the fluidized substance when the insulating layer formed over the liquid-repellent layer is fluidized. Accordingly, the liquid-repellent layer is a solid film repelling liquid. Further, the liquid-repellent layer may be provided between the first conductive layer and the second conductive layer. In addition, the liquid-repellent layer may be formed in contact with the first conductive layer or the second conductive layer, or may be included in the insulating layer.

For the substance having low wettability, a substance containing a fluorocarbon group (fluorocarbon chain) or a substance containing a silane coupling agent can be used. The silane coupling agent can form a monomolecular film; therefore, it can perform decomposition and modification efficiently and change wettability in a short time. In addition, not only a silane coupling agent containing a fluorocarbon group (fluorocarbon chain) but also that containing an alkyl group can be used, because the silane coupling agent containing an alkyl group exhibits low wettability when arranged over a substrate. Since the silane coupling agent has a different effect to lower the wettability depending on whether a contained functional group is a fluorocarbon group or an alkyl group, a material of the silane coupling agent can be appropriately determined so that necessary wettability can be obtained.

For the substance having low wettability, a substance containing a fluorocarbon group (fluorocarbon chain) or a substance containing a silane coupling agent can be used. The silane coupling agent is denoted by the chemical formula: $R_n$—Si—$X_{(4-n)}$ (n=1, 2, 3). In this chemical formula, R represents a substance containing a relatively inactive group such as an alkyl group. X represents a hydrolytic group such as halogen, a methoxy group, an ethoxy group, or an acetoxy group, which is bondable by a condensation with a hydroxyl group or adsorbed water on a substrate surface.

For the substance having low wettability, alkoxysilane containing an alkyl group for R of the silane coupling agent can be used. For example, as an organic silane, octadecyltrimethoxysilane or the like can be used. As alkyl group, an alkyl group having 2 to 30 carbon atoms is preferably used. Typically, decyltrimethoxysilane, ethyltriethoxysilane, propyltriethoxysilane, octyltriethoxysilane, decyltriethoxysilane, dodecyltriethoxysilane, octadecyltriethoxysilane (ODS), eicosyltriethoxysilane, and triacontyltriethoxysilane can be cited. In particular, a silane compound having a long chain alkyl group is preferably used because it can lower wettability. Further, decyltrichlorosilane, tetradecyltrichlorosilane, octadecyltrichlorosilane, eicosyltrichlorosilane, docosyltrichlorosilane, or the like can be also used.

As a typical example of the silane coupling agent, a fluorine-based silane coupling agent containing (such as fluoroalkylsilane (FAS)) that has a fluoroalkyl group for R can be used to further lower the wettability. R in the FAS has a structure represented by $(CF_3)(CF_2)_x(CH_2)_y$ (x is an integer in the range of 0 to 10, and y is an integer in the range of 0 to 4). When a plurality of R or X are bonded with Si, the Rs or Xs may be the same or different from one another. Typically, the following can be cited as the FAS: fluoroalkylsilane (hereinafter, also referred to as FAS) such as, heptadecafluorotetrahydrodecyltriethoxysilane, heptadecafluorotetrahydrodecyltrichlorosilane, tridecafluorotetrahydrooctyltrichlorosilane, trifluoropropyltrimethoxysilane, or tridecafluorooctyltrimethoxysilane. Further, a coupling agent in which a hydrolytic group of tridecafluorooctyltrichlorosilane is halogen can also be used. Naturally, the coupling agent is not limited to the compound described here.

Further, as the substance having low wettability, a titanate coupling agent or an aluminate coupling agent may be used. For example, isopropyltriisooctanoyl titanate, isopropyltris(dioctylpyrophosphate) titanate, isopropyltristearoyl titanate, isopropyl tris(dioctylphosphate) titanate, isopropyldimethacrylisostearoyl titanate, acetalkoxy aluminumdiisopropylate, or the like can be cited.

In the case of forming the above low wettability substance as a film in the formation region, a vapor-phase deposition method can be used for forming the low wettability substance in the formation region (for example, a substrate) by evaporating a liquid substance. Further, since the low wettability substance can be formed with the use of a spin coat method, a dip method, a droplet discharging method, and a printing method (a screen printing method, an offset printing method, or the like). The low wettability substance may also be dissolved in solvent to be solution.

For solvent of a solution containing the low wettability substance, water, alcohol, ketone, hydrocarbon-based solvent (such as aliphatic hydrocarbon, aromatic hydrocarbon, halogenated hydrocarbon), and ether-based compound; and a mixture thereof can be used. For example, methanol, ethanol, propanol, acetone, butanone, n-pentane, n-hexane, n-heptane, n-octane, n-decane, dicyclopentane, benzene, toluene, xylene, durene, indene, tetrahydronaphthalene, decahydronaphthalene, squalane, carbon tetrachloride, chloroform, methylene chloride, trichloroethane, diethyl ether, dioxane, or dimethoxyethane, tetrahydrofran or the like is used. The concentration of the above solution is not particularly limited; and, the concentration may be in a range of 0.001 wt % to 20 wt %.

Further, amine such as pyridine, triethylamine, or dimethylaniline may be mixed in the above low wettability substance. Furthermore, carboxylic acid such as formic acid or acetic acid may be added as a catalyst agent.

As for a treatment in the case of forming a monomolecular film with the use of the spin coat method in which the low wettability substance in the liquid state is attached to the formation region, a treatment temperature may be set to be a room temperature (approximately, 25° C.) to 150° C., and treatment time may be set to be several minutes to 12 hours. A treatment condition may be set depending on a property of the low wettability substance, a concentration of the solution, a treatment temperature, and treatment time.

When a thin film (regardless of a forming method) to be formed is washed with solvent that can be used in the case of making solution containing the above low wettability substance, an unreacted low wettability substance can be removed. In this case, an ultrasonic washing machine or the like may also be used.

A film containing the low wettability substance that can be used in the present invention may be a thin film that has a film thickness of 0.3 nm or more and 10 nm or less. It is to be noted that a thin film of the low wettability substance is extremely thin when the spin coat method, in which the low wettability substance in the liquid state is attached to the formation region, or the like is used to form the thin film. The thin film can be a monomolecular film that has a film thickness of 0.3 nm or more and 10 nm or less.

As an example of a composition that controls to lower wettability and forms a low wettability region, a material (fluorine-based resin) containing a fluorocarbon group (fluorocarbon chain) can be used. For the fluorine-based resin, the following can be used: polytetrafluoroethylene (PTFE: tetrafluoroethylene resin); perfluoroalkoxyalkane (PFA: tetrafluoroethylene perfluoroalkylvinylether copolymer resin); a perfluoroethylene propen copolymer (PFEP: tetrafluoroethylene-hexafluoropropylene copolymer resin); an ethylene-tetrafluoroethylene copolymer (ETFE: tetrafluoroethylene-ethylene copolymer resin); a polyvinylidene fluoride (PVDF: polyvinylidene fluoride resin); polychlorotrifluoro ethylene (PCTFE: polytrifluorochloroethylene resin); an ethylene-chlorotrifluoroethylene copolymer (ECTFE: polytrifluoro-chloroethylene-ethylene copolymer resin); a polytetrafluoro-ethylene-perfluorodioxole copolymer (TFE/PDD); a polyvinyl fluoride (PVF; vinyl fluoride resin); or the like.

When treatment using $CF_4$ plasma or the like is performed to an inorganic material and an organic material, the wettability can be lowered. As the organic material, for example, a water-soluble resin such as polyvinyl alcohol (PVA) can be mixed into a solvent such as $H_2O$. Further, PVA may be combined with another water-soluble resin.

Figure 16A:
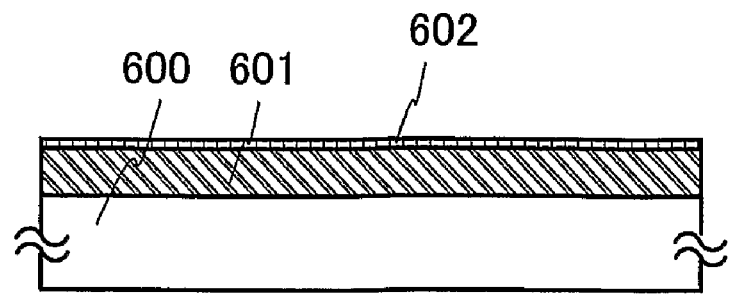
FIGS. 16A to 16C are views describing a method for manufacturing a memory device according to the present invention.
Figure 16B:
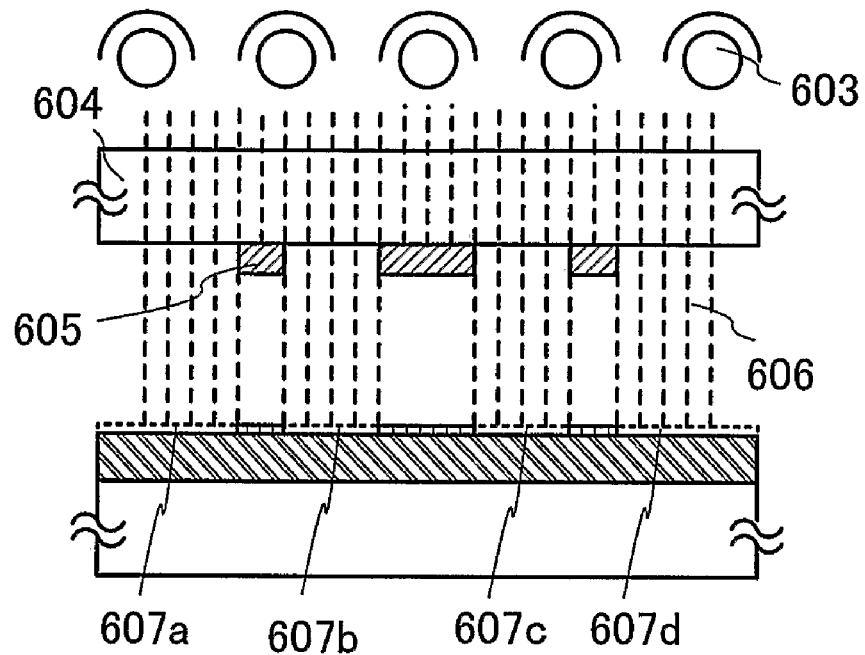
Figure 16C:
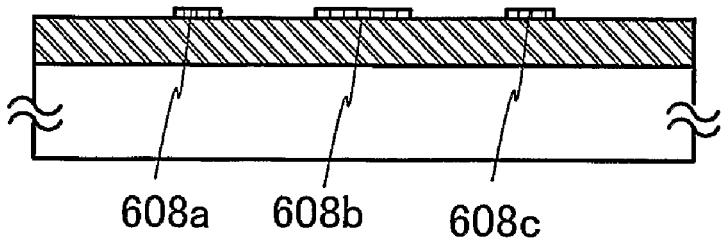
Figure 17A:
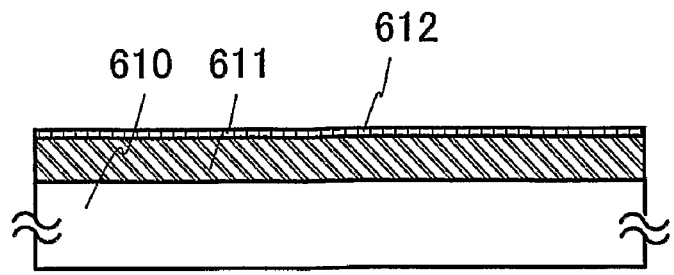
FIGS. 17A to 17D are views describing a method for manufacturing a memory device according to the present invention.
Figure 17B:
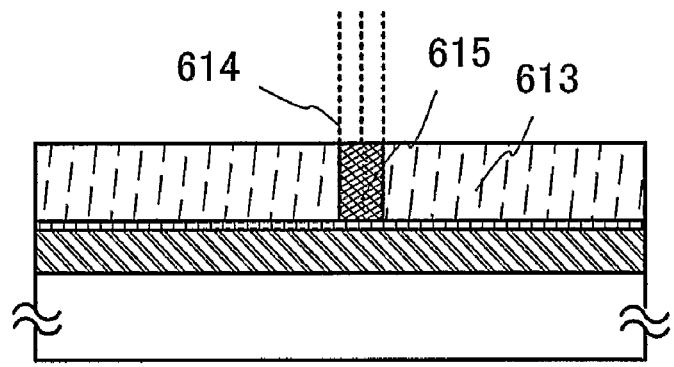
Figure 17C:
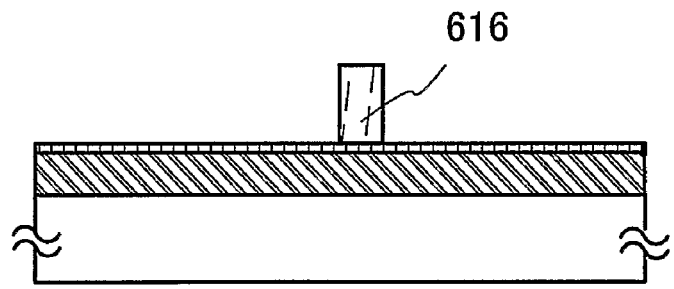
Figure 17D:
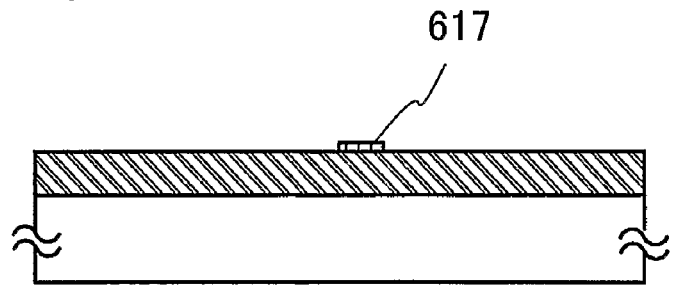

As a method for processing a liquid-repellent layer over a first conductive layer into a desired shape, the laser irradiation with the use of a mask can be performed. A first conductive layer 601 is formed over a substrate 600, and a liquid-repellent layer 602 made of a low wettability substance is formed by a spin coat method or the like (see FIG. 16A). Light 606 emitted from a light source 603 passes through a substrate 604, and metal films 605 that are formed over the substrate 604 serves as masks. The light 606 that is not blocked by the masks decomposes regions 607a, 607b, 607c, and 607d in the liquid-repellent layer 602 to modify the regions (see FIG. 16B). Therefore, liquid-repellent layers 608a, 608b, and 608c are formed over the first conductive layer 601 (see FIG. 16C).

In order to increase the processing efficiency by the light irradiation treatment, a light-absorbing material that has an absorption band in the wavelength range of the light may be added to the liquid-repellent layer. The light-absorbing material having an absorption band in the wavelength region of the light absorbs emitted light and then emits (radiates) energy such as heat to the periphery. The emitted energy affects a peripheral substance, thereby changing characteristics and modifying the peripheral substance. In case of employing the present invention, since the light-absorbing material may be selected depending on the type of wavelength of the light, the range of choices for light is widened. Therefore, the wavelength of the light can be selected, and light irradiation for modifying a surface that has preferable control can be conducted. In addition, since the light irradiation efficiency can be increased, the light irradiation treatment can be carried out sufficiently even when the light itself has low energy. Accordingly, the device or process is simplified so that cost and time are reduced, thereby improving the productivity.

As a light-absorbing material, an organic material, an inorganic material, a substance including both an organic material and an inorganic material or the like can be used. A material having an absorption band corresponding to a wavelength of light that is used may be selected from the above-mentioned materials. Further, a conductive material such as a metal or an insulating material such as an organic resin may also be used. As the inorganic material, iron, gold, copper, silicon, germanium and the like can be used. As the organic material, plastic such as polyimide and acrylic, a pigment and the like can be used. For example, as a pigment corresponding to a light wavelength of 532 nm, rhodamine B, eosin Y, methyl orange, rose bengal and the like can be used. As a pigment corresponding to a light wavelength of 300 nm to 400 nm, coumarin (such as coumarin 6H, coumarin 30, coumarin 102, coumarin 152, coumarin 153, and coumarin 545T) and Bis-MSB (an abbreviation of 1,4-bis(o-methylstyryl)benzene) can be used. In addition, carbon black, a black resin of a colorant and the like can also be employed as a pigment. Further, rhodamine 6G, dicyano methylene pyran derivative (DCM), or the like can be used as another pigment.

As the light-absorbing material, a substance having a photocatalytic function (hereinafter, simply referred to as a photocatalytic substance) can be used. A photocatalytic substance has photocatalytic activity; therefore, the photocatalytic substance is activated by light irradiation and the substance surface can be modified by energy thereof.

Titanium oxide (TiOx), strontium titanate ($SrTiO_3$), cadmium selenide (CdSe), potassium tantalate ($KTaO_3$), cadmium sulfide (CdS), zirconia ($ZrO_2$), niobium oxide ($Nb_2O_5$), zinc oxide (ZnO), iron oxide ($Fe_2O_3$), tungsten oxide ($WO_3$) or the like is desirable for the photocatalytic substance. The photocatalytic substance may be irradiated with light in the ultraviolet region (having the wavelength of 400 nm or less, preferably, 380 nm or less) to generate photocatalytic activity.

The light used for the treatment of modifying the property is not particularly limited, and any one of infrared light, visible light, ultraviolet light or a combination thereof can be used. For example, light emitted from an ultraviolet lamp, a black light, a halogen lamp, a metal halide lamp, a xenon arc lamp, a carbon arc lamp, a high-pressure sodium lamp or a high-pressure mercury lamp may be used. In this case, light from a light source may be emitted for a required period or emitted several times.

In addition, laser light (hereinafter also referred to as laser beam) may be employed. By using laser light, an exposure treatment for a more precision pattern can be performed so that an object can also be formed precisely. In the present embodiment mode, a region that is irradiated with laser light is not selected by a mask or the like, and a laser light direct writing device is used so that a treated region is selected to be processed by direct irradiation. FIGS. 17A to 17D show this embodiment mode in which laser light is used to process a resist. A first conductive layer 611 is formed over a substrate 610, and a liquid-repellent layer 612 having a low wettability substance is formed by a spin coat method or the like (see FIG. 17A). A resist 613 is formed over the liquid-repellent layer 612 and exposed by a laser beam 614. Then, a region 615 is exposed to light. The resist 613 used in the present embodiment mode is a negative type resist. Therefore, when the resist is treated by an etchant, only the region 615 exposed to light is formed as a resist 616 over the liquid-repellent layer 612 (see FIG. 17C). By processing the liquid-repellent layer 612 into a desired shape with the use of the resist 616, a liquid-repellent layer 617 can be formed (see FIG. 17D). Since the liquid-repellent layer is etched with the use of the resist that is processed into a minute and accurate shape by the laser light, the liquid-repellent layer can be formed into a desired size and shape with preferable control.

As a laser oscillator of the laser light, a laser oscillator that can emit ultraviolet light, visible light, or infrared light can be used. For the laser oscillator, an excimer laser oscillator of KrF, ArF, XeCl, Xe, or the like; a gas laser oscillator of He, He—Cd, Ar, He—Ne, HF, or the like; a solid laser oscillator using a crystal such as YAG, GdVO$_4$, YVO$_4$, YLF, or YAlO$_3$ doped with Cr, Nd, Er, Ho, Ce, Co, Ti or Tin; or a semiconductor laser oscillator of GaN, GaAs, GaAlAs, InGaAsP, or the like can be used. As for the solid laser oscillator, it is preferable to apply the fundamental wave, the second higher harmonics, and the third higher harmonics. An optical system including a shutter, a reflector such as a mirror, or a half mirror, and a cylindrical lens or a convex lens may be provided for controlling a shape of or a course of the laser light emitted from a laser oscillator.

Figure 18A:
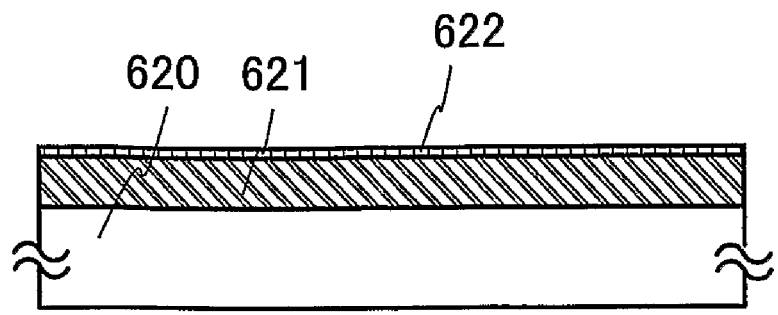
FIGS. 18A to 18C are diagrams describing a method for manufacturing a memory device according to the present invention.
Figure 18B:
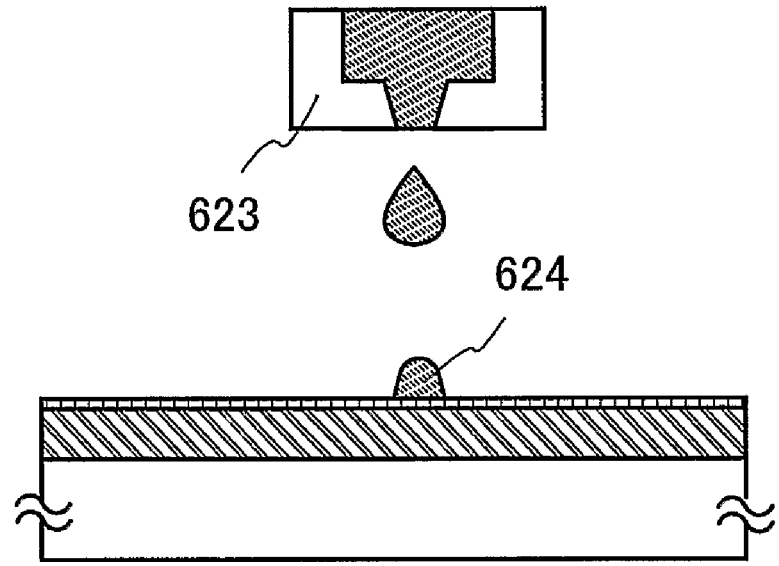
Figure 18C:
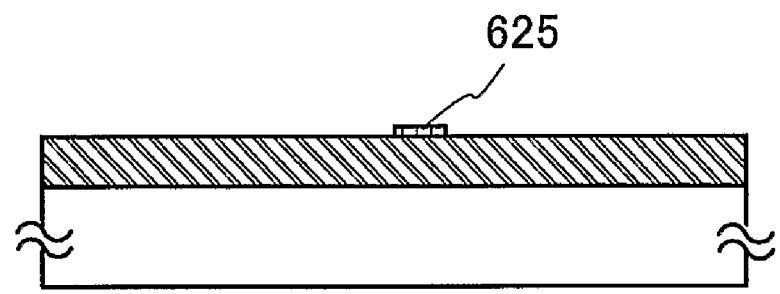

Further, a mask of the liquid-repellent layer may be formed by a droplet discharging method. FIGS. 18A to 18C show an example of forming a mask by using a droplet discharging method. A first conductive layer 621 is formed over a substrate 620, and a liquid-repellent layer 622 containing a substance having low wettability is formed by a spin coat method (see FIG. 18A). Next, a liquid composition including a material forming a mask layer is discharged on the liquid-repellent layer 622 from a droplet discharging device 623 to form a mask layer 624. Since the liquid composition has low wettability on the liquid-repellent layer, the composition is not spread over a surface of the liquid-repellent layer and the mask layer 624 can be formed into a minute shape having a micro-pattern. The shape of the mask layer 624 may be controlled depending on a degree of the wettability with respect to the liquid-repellent layer 622 (see FIG. 18B). The liquid-repellent layer 622 can be processed into a desired shape by using the mask layer 624 and a liquid-repellent layer 625 is formed (see FIG. 18C).

In the structures of the above memory cells, a quartz substrate, a silicon substrate, a metal substrate, a stainless-steel substrate, or the like, is addition to a glass substrate and a flexible substrate can be used for the substrate 750, the substrate 760, the substrate 770, and the substrate 790. The flexible substrate is a substrate that can be bent flexibly, such as a plastic substrate formed of polycarbonate, polyarylate, polyether sulfone, or the like. In addition, a film (having polypropylene, polyester, vinyl, polyvinyl fluoride, polyvinyl chloride or the like), paper of a fibrous material, a base material film (polyester, polyamide, an inorganic vapor deposition film, paper, or the like), or the like can be used. Alternatively, the memory cell array 722 can be provided over a field effect transistor (FET) formed over a semiconductor substrate such as a Si substrate, or over a thin film transistor (TFT) formed over a substrate such as a glass substrate.

Further, an element, a compound, or the like having high conductivity is used for the first conductive layers 751*a* to 751*c*, the first conductive layers 761*a* to 761*c*, the first conductive layers 771*a* to 771*c*, the first conductive layers 791*a* to 791*c*, the second conductive layer 753*b*, the second conductive layer 763*b*, the second conductive layer 773*b*, and the second conductive layer 793*b*. Typically, a single layer or a stacked layer containing an element or an alloy containing a plurality of the elements selected from gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), and tantalum (Ta) can be used. As the alloy containing a plurality of the elements, for example, an alloy containing Al and Ti, an alloy containing Al, Ti, and C, an alloy containing Al and Ni, an alloy containing Al and C, an alloy containing Al, Ni, and C, an alloy containing Al and Mo, or the like can be used.

The first conductive layers 751*a* to 751*c*, the first conductive layers 761*a* to 761*c*, the first conductive layers 771*a* to 771*c*, the first conductive layers 791*a* to 791*c*, the second conductive layer 753*b*, the second conductive layer 763*b*, the second conductive layer 773*b*, and the second conductive layer 793*b* can be formed by using an evaporation method, sputtering, a CVD method, a dispenser method, a printing method, or a droplet discharging method.

In the present embodiment mode, writing of data into the memory cell is performed by electrical action or optical action. In the case of writing data by optical action, one or both of the first conductive layers 751*a* to 751*c*, 761*a* to 761*c*, 771*a* to 771*c*, and 791*a* to 791*c*; and the second conductive layers 753*b*, 763*b*, 773*b*, and 793*b* is/are provided so as to transmit light. A light-transmitting conductive layer is formed of a transparent conductive material. Alternatively, the light-transmitting conductive layer may be formed with a thickness so that light can pass therethrough when the transparent conductive layer is not used. As the transparent conductive material, indium tin oxide (ITO), zinc oxide (ZnO), indium zinc oxide (IZO), zinc oxide added with gallium (GZO), or other light-transmitting oxide conductive materials can be used. Indium tin oxide containing ITO and silicon oxide (hereinafter, referred to ITSO), or an oxide conductive material formed using a target in which zinc oxide (ZnO) of 2 wt % to 20 wt % is mixed into indium oxide containing silicon oxide may be used.

The insulating layer 752, the insulating layer 762, the insulting layer 772, and the insulating layer 792, which are memory layers, are formed of an organic insulator, an organic compound in which conductivity is changed by electrical action or optical action, an inorganic insulator, or a mixed layer of an organic compound and an inorganic compound. In order to obtain the insulating layer 752, the insulating layer 762, the insulting layer 772, and the insulating layer 792, a single layer may be provided or a plurality of layers are stacked. Further, the mixed layer of an organic compound and an inorganic compound, and a layer having an organic compound in which conductivity is changed by electrical action or optical action, may be stacked.

It is to be noted that in a memory layer, which is referred to as an insulating layer and included in a memory element in the present specification, a small amount of current flows through when the material of the memory layer is in a thin film state, whereas in a bulk state, an insulating property is exhibited.

For an inorganic insulator that is capable of forming the insulating layer 752, the insulating layer 762, the insulting layer 772, and the insulating layer 792, silicon oxide, silicon nitride, silicon oxynitride, silicon nitride oxide, or the like can be used.

For an organic insulator that is capable of forming the insulating layer 752, the insulating layer 762, the insulting layer 772, and the insulating layer 792, an organic resin typified by polyimide, acrylic, polyamide, benzocyclobutene, an epoxy resin, or the like can be used.

For an organic compound in which conductivity is changed by electrical action or optical action, which is capable of forming the insulating layer 752, the insulating layer 762, the insulting layer 772, and the insulating layer 792, an organic compound material having high hole transporting property or an organic compound material having high electron transporting property can be used.

For a highly hole transporting organic compound material, an aromatic amine compound (in other words, a compound having a benzene ring-nitrogen bond) such as 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4"-tris(N,N-diphenyl-amino)-triphenylamine (abbreviation: TDATA), 4,4',4"-tris[N-(3-methylphenyl)-N-phenyl-amino]-triphenylamine (abbreviation: MTDATA), or 4,4'-bis(N-(4-(N,N-di-m-tolylamino)phenyl)-N-phenylamino)biphenyl (abbreviation: DNTPD); or a phthalocyanine compound such as phthalocyanine (abbreviation: $H_2Pc$), copper phthalocyanine (abbreviation: CuPc), or vanadyl phthalocyanine (abbreviation: VOPc) can be used. The substances described here are mainly substances having hole mobility of $10^{-6}$ $cm^2/Vs$ or more. However, a substance other than the above-described substances may be used as long as it has a higher hole transporting property than the electron transporting property.

In the case of providing a mixed layer of an organic compound and an inorganic compound, it is preferable to mix a highly hole transporting organic compound and highly electron accepting inorganic compound. In such a structure, many hole carriers are generated in the organic compound that has few internal carriers inherently; thus, an extremely excellent hole injecting/transporting property is obtained. As a result, the organic compound layer can have excellent conductivity.

For an inorganic compound material that easily accepts electrons, metal oxide, metal nitride, or metal oxynitride of a transition metal that belongs to any one of Groups 4 to 12 of the periodic table can be used. Specifically, metal oxide such as titanium oxide (TiOx), zirconium oxide (ZrOx), vanadium oxide (VOx), molybdenum oxide (MoOx), tungsten oxide (WOx), tantalum oxide (TaOx), hafnium oxide (HfOx), niobium oxide (NbOx), cobalt oxide (Cox), rhenium oxide (ReOx), ruthenium oxide (RuOx), zinc oxide (ZnO), nickel oxide (NiOx), or copper oxide (CuOx) can be used. Oxide is taken as an example here; however, as a matter of course, a nitride or an oxynitride of the element can be used instead.

For a highly electron transporting organic compound material, a material formed of a metal complex having a quinoline skeleton or a benzoquinoline skeleton such as tris(8-quinolinolato)aluminum (abbreviation: $Alq_3$), tris(4-methyl-8-quinolinolato)aluminum (abbreviation: $Alq_3$), bis(10-hydroxybenzo[h]-quinolinato)beryllium (abbreviation: $BeBq_2$), or bis(2-methyl-8-quinolinolato)(4-phenylphenolato)aluminum (abbreviation: BAlq), or the like can be used. Alternatively, a material of a metal complex having an oxazole or thiazole ligand such as bis[2-(2-hydroxyphenyl)benzoxazolate]zinc (abbreviation: $Zn(BOX)_2$) or bis[2-(2-hydroxyphenyl)benzothiazolate]zinc (abbreviation: $Zn(BTZ)_2$), or the like can be used. In addition to the metal complex, 2-(4-biphenylyl)-5-(4-tert-butylphenyl)-1,3,4-oxadiazole (abbreviation: PBD); 1,3-bis[5-(p-tert-butylphenyl)-1,3,4-oxadiazole-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); or the like can be used. The substances described here are mainly substances having electron mobility of $10^{-6}$ $cm^2/Vs$ or more. However, a substance other than the above-described substances may also be used as long as it has a higher electron transporting property than the hole transporting property.

In the case of providing a mixed layer of an organic compound and an inorganic compound, it is preferable to mix a highly electron transporting organic compound material and a highly electron donating inorganic compound material. In such a structure, many electron carriers are generated in the organic compound that has few internal carriers; thus, an excellent electron injecting/transporting property is obtained. As a result, the organic compound layer can have excellent conductivity.

For the inorganic compound material that easily donates electrons, alkali metal oxide, alkaline-earth metal oxide, rare-earth metal oxide, alkali metal nitride, alkaline-earth metal nitride, or rare-earth metal nitride can be used. Specifically, lithium oxide (LiOx), strontium oxide (SrOx), barium oxide (BaOx), erbium oxide (ErOx), sodium oxide (NaOx), lithium nitride (LiNx), magnesium nitride (MgNx), calcium nitride (CaNx), yttrium nitride (YNx), or lanthanum nitride (LaNx), or the like can be used.

Furthermore, any inorganic compound material, which easily accepts electrons from an organic compound and easily supplies electrons to an organic compound, may be used for the inorganic compound material. In addition to aluminum oxide (AlOx), gallium oxide (GaOx), silicon oxide (SiOx), germanium oxide (GeOx), indium tin oxide (ITO), or the like, a variety of metal oxide, metal nitride, or metal oxynitride may be used as the inorganic compound material.

When the insulating layer 752, the insulating layer 762, the insulating layer 772, and the insulating layer 792 are formed of a compound selected from metal oxide or metal nitride and a highly hole transporting compound, a compound having large steric hindrance (having not a planar structure but a spatial structure) may be added. As the compound having large steric hindrance, 5,6,11,12-tetraphenyltetracene (abbreviation: rubrene) is preferable. Alternatively, hexaphenylbenzene, t-butylperylene, 9,10-di(phenyl)anthracene, coumarin 545T, or the like can also be used. Further, a dendrimer or the like is also effective.

Further, a luminescent substance such as 4-dicyanomethylene-2-methyl-6-[2-(1,1,7,7-tetramethyljulolidine -9-yl) ethenyl]-4H-pyr an (abbreviation: DCJT); 4-dicyanomethylene-2-t-butyl-6-[2-(1,1,7,7-tetramethyljulolidine -9-yl) ethenyl]-4H-pyra n; periflanthene; 2,5-dicyano-1,4-bis[2-(10-methoxy-1,1,7,7-tetramethyljulolidine -9-yl)ehtenyl] benzene; N,N'-dimethylquinacridone (abbreviation: DMQd); coumarin 6; coumarin 545T; tris(8-quinolinolato) aluminum (abbreviation: $Alq_3$); 9,9'-bianthryl; 9,10-diphenylanthracene (abbreviation: DPA); 9,10-bis(2-naphthyl)anthracene (abbreviation: DNA); and 2,5,8,11-tetra-t-butylperylene (abbreviation: TBP) may be provided between a layer that is formed of a highly electron transporting organic compound material and a layer that is formed of a highly hole transporting organic compound material.

A material in which electric resistance is changed by optical action can be used for the insulating layer 752, the insulating layer 762, the insulating layer 772, and the insulating layer 792. For example, a conjugated polymer doped with a compound that produces an acid by light absorption (photoacid generator) may be used. As the conjugated polymer, polyacetylene, polyphenylene vinylene, polythiophene, polyaniline, polyphenylene ethynylene, or the like may be used. As the photoacid generator, arylsulfonium salts, aryliodonium salts, o-nitrobenzyl tosylate, aryl sulfonic acid p-nitrobenzyl ester, sulfonyl acetophenone, Fe-allene complex $PF_6$ salts or the like may be used.

The insulating layer 752, the insulating layer 762, the insulating layer 772, and the insulating layer 792 can be formed by an evaporation method, an electron beam evaporation method, sputtering, a CVD method, or the like. Further, the mixed layer containing an organic compound and an inorganic compound can be formed by concurrently depositing each material. For example, the mixed layer can be formed by combining the same or different methods such as coevaporation by resistance heating evaporation, coevaporation by electron beam evaporation, coevaporation by resistance heating evaporation and electron beam evaporation, deposition by resistance heating evaporation and sputtering, or deposition by electron beam evaporation and sputtering.

It is to be noted that the insulating layer 752, the insulating layer 762, the insulating layer 772, and the insulating layer 792 are formed to have a film thickness to change conductivity of a memory element by electrical action or optical action.

As the partition walls (insulating layers) 51a and 51b, the partition wall (insulating layer) 755, the partition wall (insulating layer) 765, and the partition wall (insulating wall) 775, silicon oxide, silicon nitride, silicon oxynitride, aluminum oxide, aluminum nitride, aluminum oxynitride, or another inorganic insulating material; acrylic acid, methacrylic acid, or a derivative thereof; a heat-resistant polymer material such as polyimide, aromatic polyamide, or polybenzimidazole; or a siloxane material may be used. It is to be noted that the siloxane material corresponds to resin including a Si—O—Si bond. Siloxane has a skeleton structure formed by a bond of silicon (Si) and oxygen (O). As a substituent, an organic group containing at least hydrogen (for example, an alkyl group or aromatic hydrocarbon) is used. As a substituent, a fluoro group may be used. In addition, as a substituent, an organic group containing at least hydrogen and a fluoro group may be used. Alternatively, a resin material such as a vinyl resin of polyvinyl alcohol, polyvinylbutyral, or the like, an epoxy resin, a phenol resin, a novolac resin, an acrylic resin, a melamine resin, or a urethane resin is used. Further, an organic material such as benzocyclobutene, parylene, or polyimide; a compound material made by the polymerization of a siloxane-based polymer or the like; a composition material containing a water-soluble homopolymer and a water-soluble copolymer; or the like may be used. As a manufacturing method, a vapor phase growth method such as a plasma CVD method or a thermal CVD method, or sputtering can be used. A dispenser method, a droplet discharging method, or a printing method (a method for forming a pattern, such as a screen printing method or an offset printing method) can also be used. A coat film obtained by a coating method can also be used.

After forming a conductive layer, an insulating layer or the like by discharging a composition to be formed by a droplet discharging method, a surface thereof may be planarized by pressing with pressure to improve planarity. As a pressing method, unevenness of the surface may be reduced by moving a roller-shaped object over the surface, or the surface may be perpendicularly pressed with a flat plate-shaped object. A heating step may also be performed at the time of pressing. Alternatively, the unevenness of the surface may be eliminated with an air knife after softening or melting the surface with a solvent or the like. A CMP method may be also used for polishing the surface. This step can be employed in planarizing a surface when unevenness is generated by a droplet discharging method.

In the present embodiment mode, as for the above structure, rectifying elements may be provided between the first conductive layers 751a to 751c, 761a to 761c, 771a to 771c; and 791a to 791c and the insulating layers 752, 762, 772, and 792, respectively. The rectifying element refers to a transistor or a diode in which a gate electrode and a drain electrode are connected, or a diode. Since current flows in only one direction by providing a diode having rectifying property, errors are reduced and margin of reading is improved. It is to be noted that rectifying elements may be provided between the insulating layers 752, 762, 772, and 792; and the second conductive layers 753b, 763b, 773b, and 793b, respectively.

In accordance with the memory element according to the present invention, driving voltage in writing of data can be reduced. As a result, a memory device and a semiconductor device with low power consumption can be provided at low cost with high yield.

Embodiment Mode 2

In the present embodiment mode, a memory device that has a different structure from the above Embodiment Mode 1, will be described. Concretely, the case where the memory device has an active matrix structure will be shown.

Figure 5:
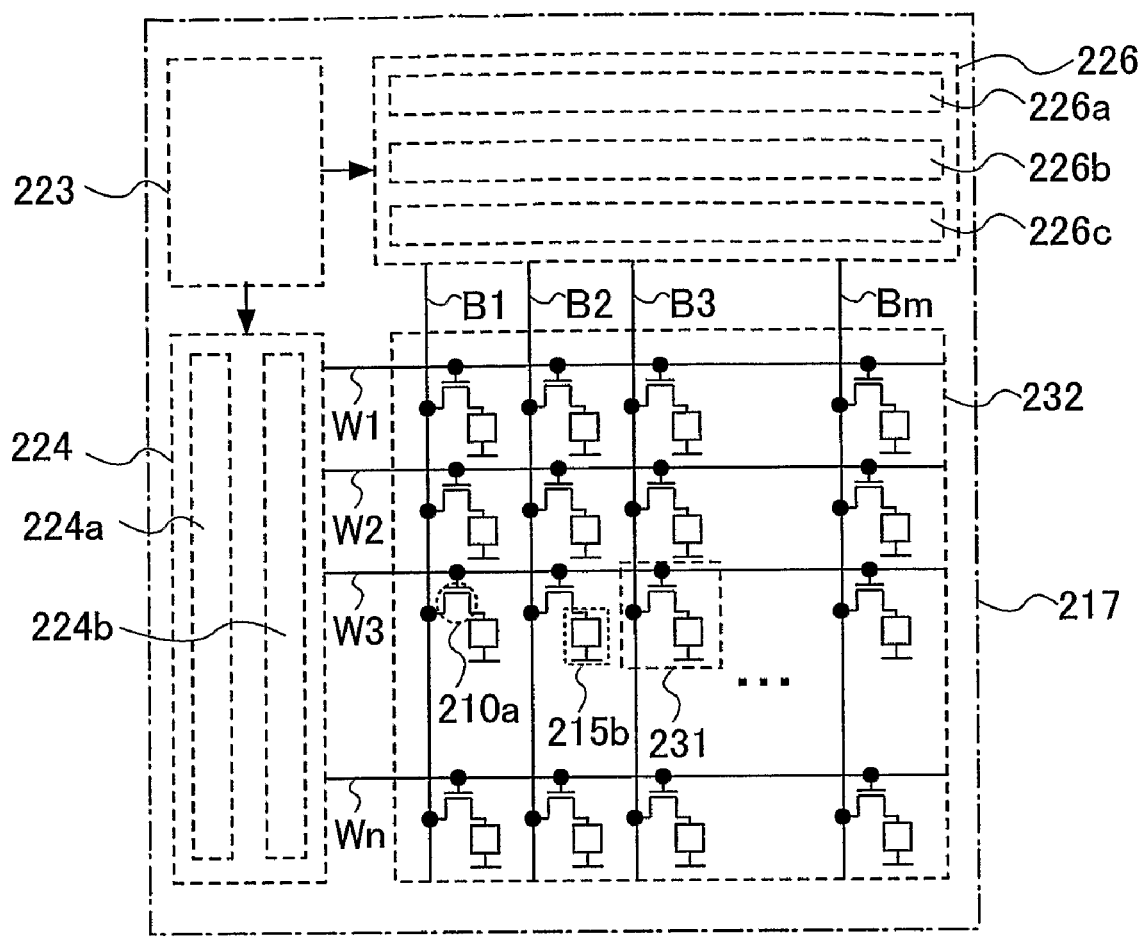
FIG. 5 is a diagram describing a memory device according to the present invention.

FIG. 5 shows an example of a structure of a memory device that is shown in the present embodiment mode. The memory device includes a memory cell array 232 provided with memory cells 231 in a matrix, a bit line driving circuit 226 having a column decoder 226a, a reading circuit 226b, and a selector 226c, a word line driving circuit 224 having a low decoder 224a and a level shifter 224b, and a interface 223 having a writing circuit and the like and communicating with outside. It is to be noted that a structure of a memory device 217 shown here is only one example. The memory device 217 may include other circuits such as a sense amplifier, an output circuit, and a buffer, and the like. The writing circuit may be provide in the bit line driving circuit.

The memory cell array 232 includes a first wiring that forming a word line Wy ($1 \leq y \leq n$), a second wiring that forming a bit line Bx ($1 \leq x \leq m$), a transistor 210a, a memory element 215b, and the memory cell 231. The memory element 215b has a structure in which an insulating layer is interposed between a pair of conductive layers.

Figure 4A:
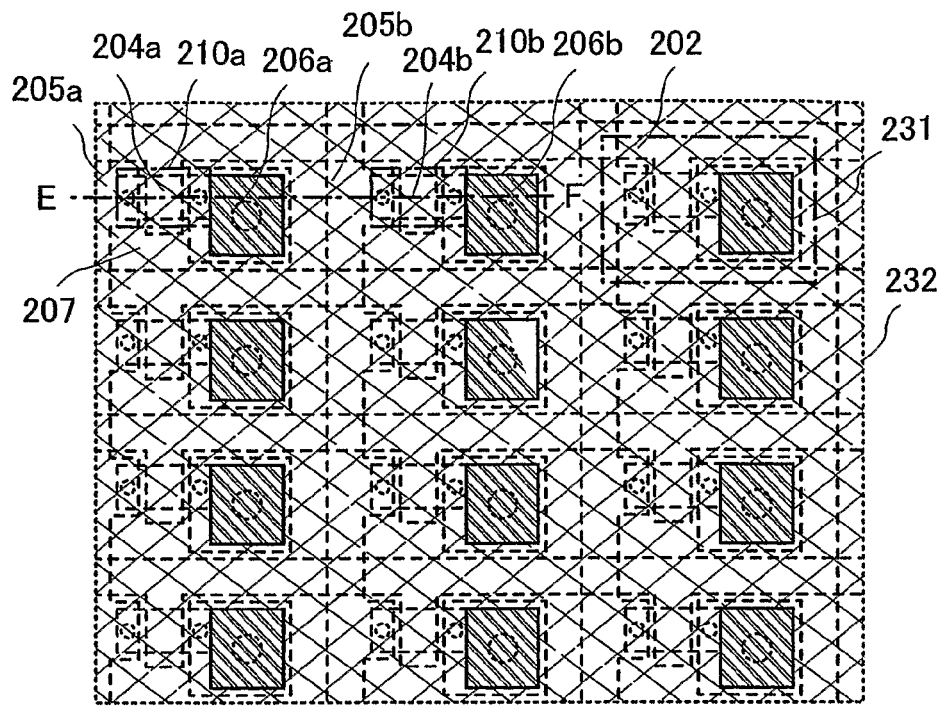
FIGS. 4A and 4B are views describing a memory device according to the present invention.
Figure 4B:
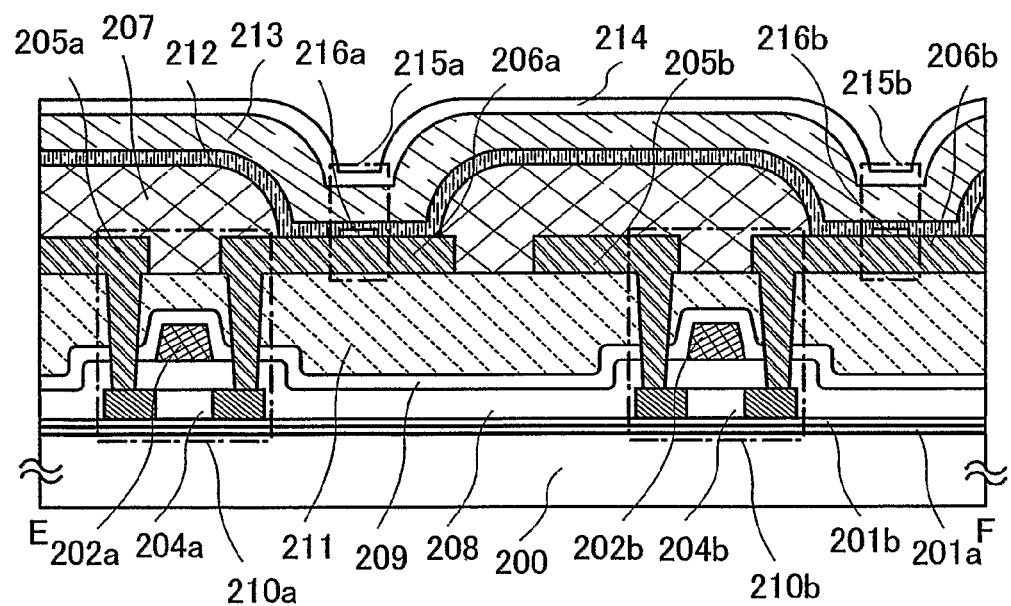

FIG. 4A shows a top view of the memory cell array 232, and FIG. 4B shows a cross-sectional view taken along a line E-F in FIG. 4A. In FIG. 4A, an insulating layer 212 and an insulating layer 214 are omitted, however, each of the insulating layers 212 and 214 is provided as shown in FIG. 4B.

In the memory cell array 232, a first wiring 205a and a first wiring 205b extended in a first direction, and a second wiring 202 extended in a second direction that is perpendicular to the first direction are provided in a matrix. Each of the first wirings is connected to a source electrode or a drain electrode of a transistor 210a and a transistor 210b. The second wiring is connected to a gate electrode of the transistor 210a and the transistor 210b. Further, each of a first conductive layer 206a and a first conductive layer 206b is connected to a source electrode or a drain electrode of the transistors 210a and 210b, which are not connected with the first wirings. Then, an insulating layer 212 and a second conductive layer 213 are stacked over each of the first conductive layer 206a and the first conductive layer 206b to provide a memory element 215a and a memory element 215b. Partition walls (insulating layers) 207 are provided between adjacent each memory cell 231, and the insulating layer 212 and the second conductive layer 213 are stacked over the first conductive layers and the partition walls (insulating layers) 207. An insulating layer 214 to be a protective layer is provided over the second conductive layer 213. Further, as the transistors 210a and 210*b*, thin film transistors are employed (see FIG. 4B). A memory device in FIG. 4B is provided over a substrate 200, which includes an insulating layer 201*a*; an insulating layer 201*b*; an insulating layer 208; an insulating layer 209; an insulating layer 211; a semiconductor layer 204*a*, a gate electrode 202*a* and a wiring 205*a* serving as a source electrode or a drain electrode forming the transistor 210*a*; and a semiconductor layer 204*b*, a gate electrode 202*b* and a wiring 205*b* serving as a source electrode or a drain electrode forming the transistor 210*b*. A liquid-repellent layer 216*a* and a liquid-repellent layer 216*b* are formed over the first conductive layer 206*a* and the first conductive layer 206*b*, respectively. Since the liquid-repellent layers 216*a* and 216*b* are formed with the use of a mask layer by a droplet discharging method in a processing step, the liquid-repellent layers 216*a* and 216*b* have a circular shape in the top view.

In the present embodiment mode, the liquid-repellent layers 216*a* and 216*b*, which are low wettability regions with respect to compositions having fluidity, are selectively formed over surfaces of the first conductive layers 206*a* and 206*b* to form two kinds of regions having different wettability (a high wettability region and a low wettability region). Since the compositions having fluidity transfer toward a region that has higher wettability without staying in the low wettability liquid-repellent layers 216*a* and 216*b*, the compositions having fluidity flow to a high wettability region without keeping a shape in a solid state. Therefore, a film thickness of the insulating layer 212 is uneven, and the insulating layer 212 is transformed so that the first conductive layer and the second conductive layer are short-circuited. Further, an electric field may concentrate at a region where a film thickness of the insulating layer is thin, and the dielectric breakdown may generate and cause short-circuit of the first conductive layer and the second conductive layer. Accordingly, conductivity of the memory element changes before and after applying voltage.

Further, in the present embodiment mode, the insulating layer 212 is formed in contact with the first conductive layer 206*a* and the partition wall (insulating layer) 207 that covers an end of the first conductive layer 206*a*. Therefore, when a surface of the partition wall (insulating layer) 207 has higher wettability with respect to a composition having fluidity that is made of a material of the insulating layer 212 than that of a surface of the first conductive layer 206*a*, the composition having fluidity is transferred easily, which is preferable.

As a result, writing can be performed with low power consumption.

Figure 6:
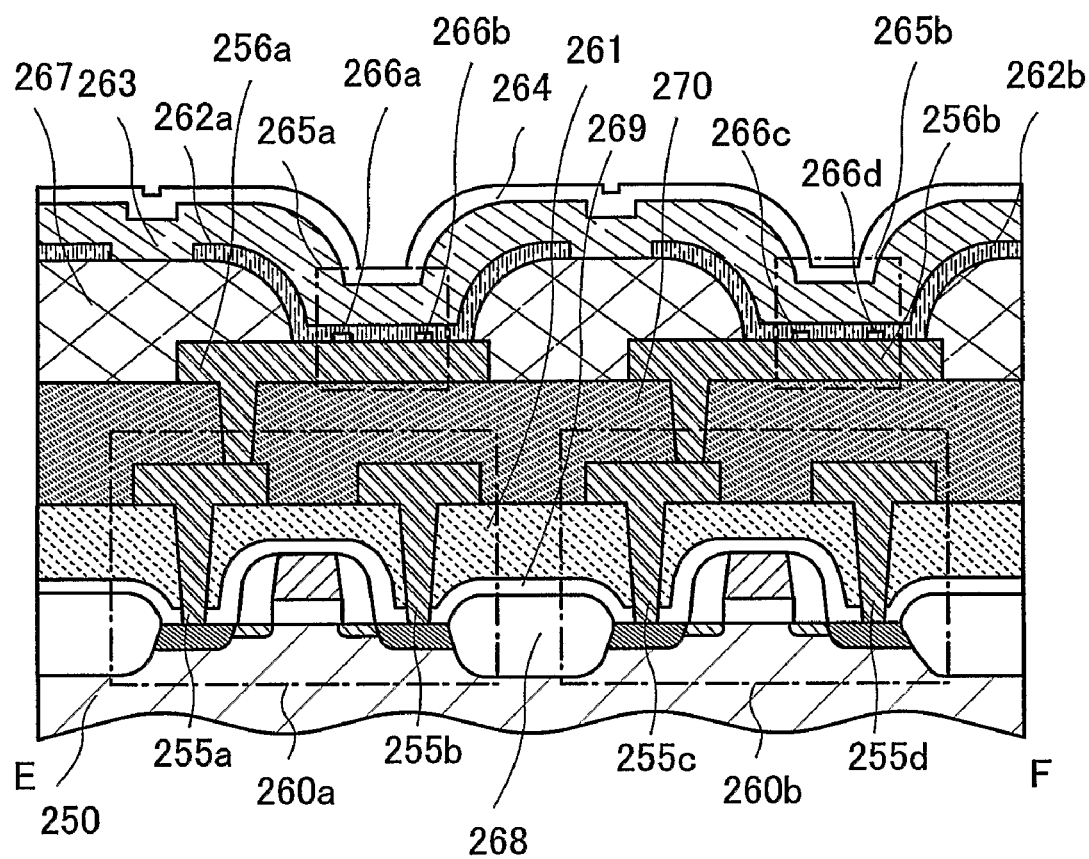
FIG. 6 is a view describing a memory device according to the present invention.

As shown in FIG. 6, a memory element 265*a* and a memory element 265*b* may be connected to a field effect transistor 260*a* and a field effect transistor 260*b* provided over a single crystal semiconductor substrate 250. Here, an insulating layer 270 is provided to cover source or drain electrode layers 255*a* to 255*d* of the field effect transistor 260*a* and the field effect transistor 260*b*. Over the insulating layer 270, a first conductive layer 256*a*, a first conductive layer 256*b*, a partition wall (insulating layer) 267, an insulating layer 262*a*, an insulating layer 262*b*, and a second conductive layer 263 are provided to form a memory element 265*a* and a memory element 265*b*. An insulating layer may be selectively provided by using a mask in each memory cell in the same manner as the insulating layers 262*a* and 262*b*. In addition, a memory device shown in FIG. 6 includes an element isolation region 268, an insulating layer 269, an insulating layer 261, and an insulating layer 264. Liquid-repellent layers 266*a* and 266*b*; and liquid-repellent layers 266*c* and 266*d* are respectively formed over the first conductive layer 256*a* and the first conductive layer 256*b*, in which two liquid-repellent layers are formed over one conductive layer.

As described above, the first conductive layer can be arranged freely by providing the insulating layer 270 to form a memory element. Accordingly, in the structure of FIG. 4B, the memory elements 215*a* and 215*b* are required to be provided in the regions where the source or drain electrode layers of the transistors 210*a* and 210*b* are not provided; however, for example, it is possible to form the memory element 215*a* and the memory element 215*b* in the upper side of the transistors 210*a* and 210*b* by employing the above structure. As a result, the memory device 217 can be more highly integrated.

Furthermore, the transistor 210*a* and the transistor 210*b* can be provided in any structure as long as the transistors 210*a* and 210*b* can serve as a switching element. As a semiconductor layer, various types of semiconductors such as an amorphous semiconductor, a crystalline semiconductor, a polycrystalline semiconductor, and a microcrystalline semiconductor can be used, and an organic transistor may be formed by using an organic compound. FIG. 4A shows an example of providing a planar thin film transistor over an insulating substrate; however, a transistor can also be formed to have a staggered structure, an inverted staggered structure, or the like.

Figure 7:
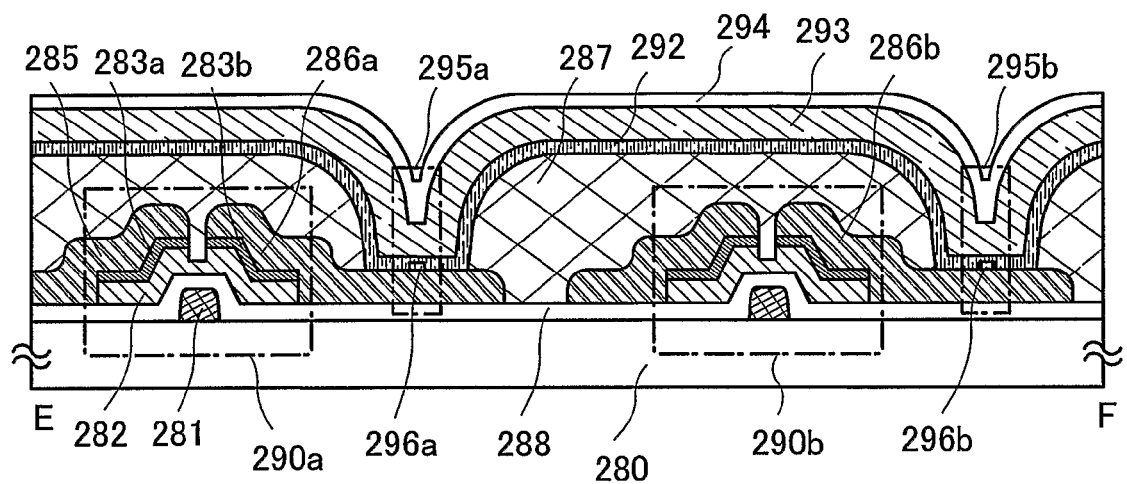
FIG. 7 is a view describing a memory device according to the present invention.

FIG. 7 shows an example of using a thin film transistor having an inverted staggered structure. A transistor 290*a* and a transistor 290*b*, which are thin film transistor having an inverted staggered structure, are provided over a substrate 280. The transistor 290*a* includes an insulating layer 288, a gate electrode layer 281, an amorphous semiconductor layer 282, a semiconductor layer 283*a* having one conductivity type, a semiconductor layer 283*b* having other conductivity type, and source or drain electrode layers 285. The source or drain electrode layers are a first conductive layer 286*a* and a first conductive layer 286*b* forming a memory element. A partition wall (insulating layer) 287 is stacked to cover ends of the first conductive layers 286*a* and 286*b*. An insulating layer 292, a second conductive layer 293, and an insulating layer 294 that is a protective layer are formed over the first conductive layers 286*a* and 286*b* and the partition wall (insulating layer) 287 to form a memory element 295*a* and a memory element 295*b*. A liquid-repellent layer 296*a* and a liquid-repellent layer 296*b* are formed over the first conductive layer 286*a* and the first conductive layer 286*b*, respectively.

In the present embodiment mode, the liquid-repellent layer 296*a* and the liquid-repellent layer 296*b*, which are low wettability regions with respect to compositions having fluidity, are selectively formed over surfaces of the first conductive layer 286*a* and the first conductive layer 286*b* to form two kinds of regions (a high wettability region and a low wettability region) having different wettability. Since the compositions having fluidity transfer toward a region that has higher wettability without staying in the low wettability liquid-repellent layers 296*a* and 296*b*, the compositions having fluidity flow to a high wettability region without keeping a shape in a solid state. Therefore, a film thickness of the insulating layer 292 is uneven, and the insulating layer 292 is transformed so that the first conductive layers 286*a* and 286*b*; and the second conductive layer 293 are short-circuited. Further, an electric field may concentrate at a region where a film thickness of the insulating layer 292 is thin, and the dielectric breakdown may generate to cause short-circuit of the first conductive layer and the second conductive layer. Accordingly, conductivity of the memory element changes before and after applying voltage.

Further, in the present embodiment mode, the insulating layer 292 is formed in contact with the first conductive layers 286a and 286b and the partition wall (insulating layer) 287 that covers ends of the first conductive layers 286a and 286b. Therefore, when a surface of the partition wall (insulating layer) 287 has higher wettability with respect to a composition having fluidity that is made from a material of the insulating layer 292 than that of a surface of the first conductive layer 286a, the composition having fluidity is transferred easily, which is preferable.

As a result, writing can be performed with low power consumption.

In a memory device shown in FIG. 7, a gate electrode 281, the source or drain electrode layer 285, the first conductive layers 286a and 286b, and the partition wall (insulating layer) 287 are formed by using a droplet discharging method. A droplet discharging method is a method in which a composition containing a component forming material, which is fluid, is discharged (jetted) as a droplet to form a desired pattern. A droplet containing a component forming material is discharged on a formation region of the component and solidified by baking, drying, and the like to form a component having a desired pattern.

Figure 19:
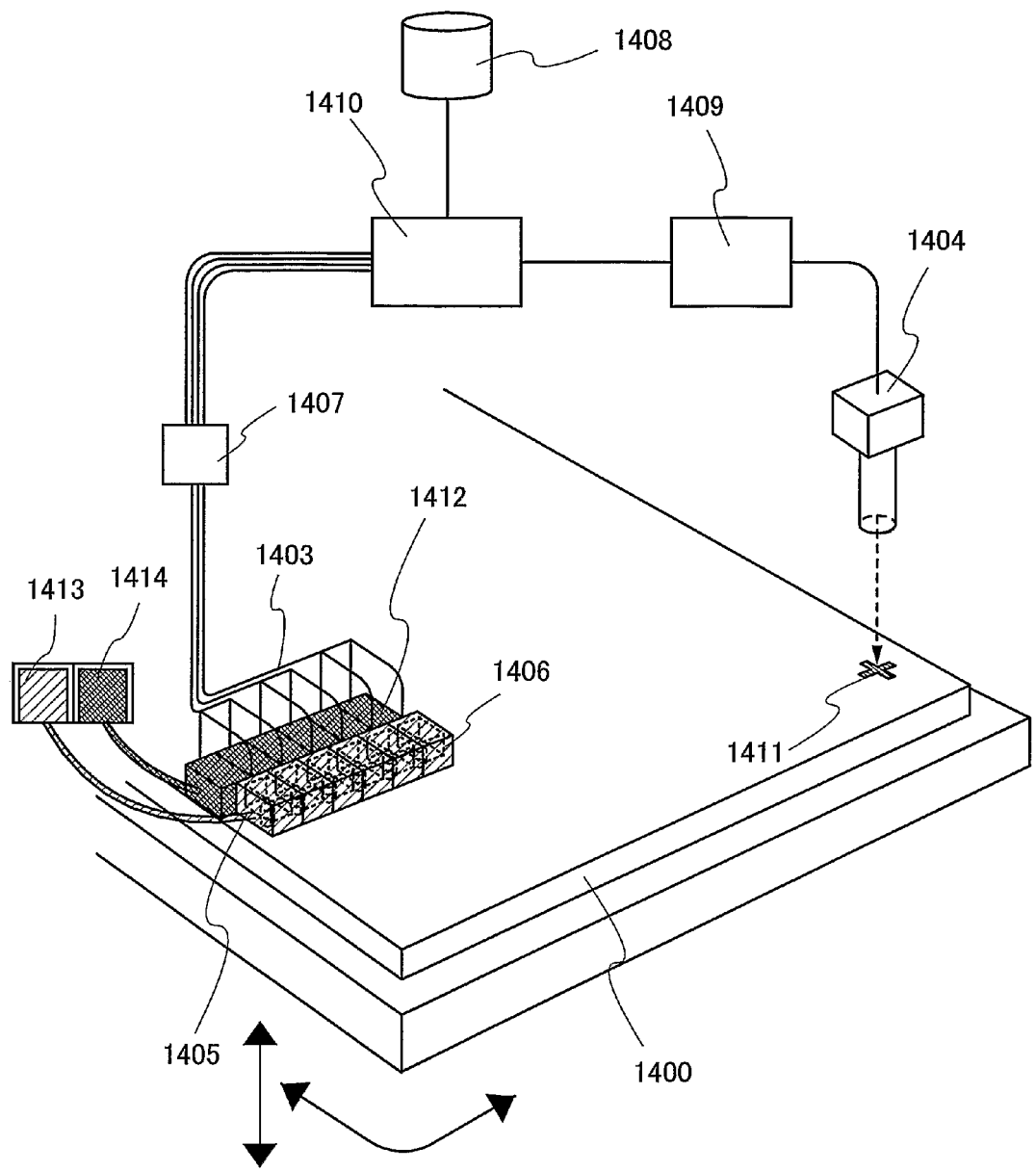
FIG. 19 is a view describing a structure of a droplet discharging device that can be applied to the present invention.

FIG. 19 shows one mode of a droplet discharge device used for a droplet discharging method. Each of heads 1405 and 1412 of a droplet discharge means 1403 is connected to a control means 1407, and this control means 1407 performs control a computer 1410 so that a preprogrammed pattern can be drawn. The drawing timing may be determined, for example, based on a marker 1411 that is formed over a substrate 1400 as a reference. Alternatively, a reference point may be fixed based on an edge of the substrate 1400 as a reference. The reference point is detected by an imaging means 1404, and changed into a digital signal by an image processing means 1409. Then, the digital signal is recognized by the computer 1410 to generate a control signal, and the control signal is transmitted to the control means 1407. An image sensor or the like using a charge coupled device (CCD) or a complementary metal oxide semiconductor can be used as the imaging means 1404. Naturally, information about a pattern to be formed over the substrate 1400 is stored in a storage medium 1408, and the control signal is transmitted to the control means 1407 based on the information, so that each of the heads 1405 and 1412 of the droplet discharge means 1403 can be individually controlled. The heads 1405 and 1412 are supplied with a material to be discharged from material supply sources 1413 and 1414 through pipes, respectively.

The head 1405 has an inside structure that has a space filled with a liquid material as shown by dotted lines 1406 and a nozzle that is a discharge opening. Although it is not shown, an inside structure of the head 1412 is similar to that of the head 1405. When the nozzle sizes of the heads 1405 and 1412 are different from each other, different materials with different widths can be discharged simultaneously. A conductive material, an organic material, an inorganic material, and the like can also be respectively discharged from one head to draw a pattern. In a case of drawing in a wide area such as an interlayer film, one material can be simultaneously discharged from a plurality of nozzles to improve throughput, and thus, drawing can be performed. When a large-sized substrate is used, the heads 1405 and 1412 can freely scan over the substrate in directions indicated by arrows, and a region to be drawn can be freely set. Thus, a plurality of the same patterns can be drawn over one substrate.

In a case of forming a conductive layer by a droplet discharging method, a conductive layer is formed as follows: a composition containing a particle shaped conductive material is discharged, and fused or welded and joined by baking to solidify the composition. A conductive layer (or an insulating layer) formed by discharging and baking the composition containing the conductive material as described above tends to show a polycrystalline state having many grain boundaries whereas a conductive layer (or an insulating layer) formed by sputtering tends to show a columnar structure.

Further, any structure may be used for a semiconductor layer included in the transistors. For example, an impurity region (including a source region, a drain region, and an LDD region) may be formed, and either a p-channel type or an n-channel type may be used. An insulating layer (sidewall) may be provided to be in contact with a side surface of the gate electrode, or a silicide layer may be formed in either or both of the source and drain regions, and the gate electrode. As a material for the silicide layer, nickel, tungsten, molybdenum, cobalt, platinum, or the like can be used.

As a material and a forming method of the first conductive layers 206a, 206b, 256a, 256b, 286a, and 286b, and the second conductive layers 213, 263, and 293 shown in the present embodiment mode, any one of the materials and the forming methods shown in the above Embodiment Mode 1 can be employed.

Further, the insulating layers 212, 262a, 262b, and 292 can be provided by using the same material and the forming method as the insulating layer 752 shown in the above Embodiment Mode 1.

In addition, a rectifying element may be provided between the first conductive layers 206a, 206b, 256a, 256b, 286a, and 286b, and the insulating layers 212, 262a, 262b, and 292. The rectifying element typically refers to a transistor or a diode in which a gate electrode and a drain electrode are connected or a diode. For example, a PN junction diode provided by stacking an n-type semiconductor layer and a p-type semiconductor layer can be used. In this manner, since current flows only in one direction by providing the rectifying element, errors are reduced and margin of reading is improved. In the case of providing a diode, not only a diode having a PN junction but also a diode having another structure such as a diode having a PIN junction or an avalanche diode may be provided. It is to be noted that the rectifying element may be provided between the insulating layers 212, 262a, 262b, and 292, and the second conductive layers 213, 263, and 293.

In accordance with the memory element of the present invention, it is possible to reduce the driving voltage at the time of writing data. As a result, a memory device and a semiconductor device with low power consumption can be provided at low cost with high yield.

Embodiment Mode 3

In the present embodiment, an example of a semiconductor divide that includes the memory device shown in the above embodiment mode will be described with reference to the drawings.

A semiconductor device shown in this embodiment mode is capable of reading and writing data without contact. Data transmission method is broadly classified into three of an electromagnetic coupling method of communicating by mutual induction with a pair of coils disposed in the opposed position, an electromagnetic induction method of communicating by an inductive electromagnetic field, and an electric wave method of communicating by using electric waves, and any of these methods may be employed. An antenna that is used for transmitting data can be provided in two ways. One way is to provide the antenna over a substrate provided with a plurality of elements and a memory element, and the other way is to provide a terminal portion over a substrate provided with a plurality of elements and a memory element and to connect an antenna provided over another substrate to the terminal portion.

First, an example of a structure of a semiconductor device in the case of providing an antenna over a substrate provided with a plurality of elements and a memory element will be described with reference to FIG. 10.

Figure 10:
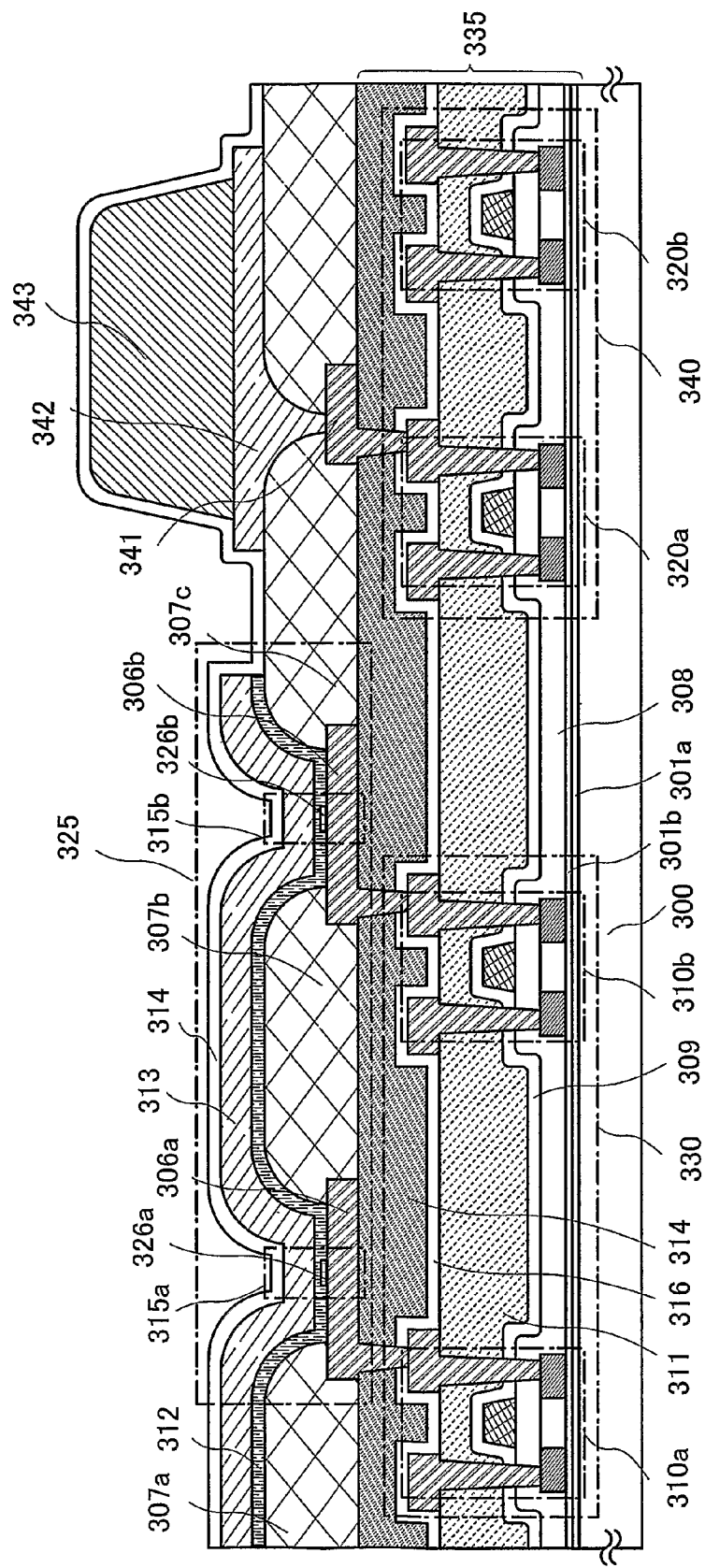
FIG. 10 is a view describing a semiconductor device according to the present invention.

FIG. 10 shows a semiconductor device including a memory device that has an active matrix structure. A transistor part 330 including transistors 310*a* and 310*b*, a transistor part 340 including transistors 320*a* and 320*b*, and an element forming layer 335 including insulating layers 301*a*, 301*b*, 308, 309, 311, 316, and 314 are provided over a substrate 300. A memory element portion 325 and a conductive layer 343 serving as an antenna are provided in the upper side of the element forming layer 335.

It is to be noted that, here, the case where the memory element portion 325 or the conductive layer 343 serving as an antenna is provided in the upper side of the element forming layer 335 is shown; however, the present invention is not to limited to this structure, and it is possible to provide the memory element portion 325 or the conductive layer 343 serving as an antenna in the lower side of the element forming layer 335 or in the same layer thereof.

The memory element portion 325 includes a memory element 315*a* and a memory element 315*b*. The memory element 315*a* is formed by stacking a partition wall (insulating layer) 307*a*, a partition wall (insulating layer) 307*b*, an insulating layer 312, and a second conductive layer 313 over a first conductive layer 306*a*. The memory element 315*b* is provide by stacking the partition wall (insulating layer) 307*b*, a partition wall (insulating layer) 307*c*, the insulating layer 312, and the second conductive layer 313 over a first conductive layer 306*b*. Further, an insulating layer 314 serving as a protective film is formed to cover the second conductive layer 313. The first conductive layers 306*a* and 306*b* in which the plurality of memory elements 315*a* and 315*b* are respectively formed, are connected to a source electrode layer or a drain electrode layer of the transistors 310*a* and 310*b*. In other words, each memory element is connected to one transistor. The insulating layer 312 is formed entirely to cover the first conductive layers 306*a* and 306*b*, and the partition walls (insulating layers) 307*a*, 307*b*, and 307*c*; however, the insulating layer 312 may be formed selectively in each memory cell. It is to be noted that the memory elements 315*a* and 315*b* can be formed by using the material or the forming method described in the above embodiment mode. A liquid-repellent layer 326*a* and a liquid-repellent layer 326*b* each of which is to be low wettability regions are formed over the first conductive layers 306*a* and 306*b*, respectively. Surface of the first conductive layers 306*a* and 306*b* have different wettability regions.

In the memory elements 315*a* and 315*b*, each surface of the liquid-repellent layers 326*a* and 326*b* has lower wettability with respect to a composition having fluidity of a material forming the insulating layer 312 than that of the peripheral first conductive layers 306*a* and 306*b*. Therefore, the composition having fluidity of a material forming the insulating layer 312 transfers from each of the liquid-repellent layers 326*a* and 326*b*. Then, since a thickness of the insulating layer 312 is uneven, short-circuit of the memory elements 315*a* and 315*b* is caused.

In the memory element 315*a*, as described in the above embodiment mode, a rectifying element may be provided between the first conductive layer 306*a* and the insulating layer 312, or between the insulating layer 312 and the second conductive layer 313. The rectifying element can also be provided to use the above material. In addition, the same manner can be employed in the memory element 315*b*.

Here, the conductive layer 343 serving as an antenna is provided over a conductive layer 341 that is formed of the same layer with the first conductive layers 306*a* and 306*b*, and a conductive layer 342 that is formed of the same layer with the second conductive layer 313. A conductive layer serving as an antenna may be formed of the same layer with the second conductive layer 313. Further, the conductive layer 341 is connected to a source electrode layer or a drain electrode layer of the transistor 320*a*.

As a material of the conductive layer 343 serving as an antenna, an element selected from gold (Au), platinum (Pt), nickel (Ni), tungsten (W), molybdenum (Mo), cobalt (Co), copper (Cu), aluminum (Al), manganese (Mn), and titanium (Ti) or an alloy containing a plurality of the elements can be used. Further, an evaporation method, sputtering, a CVD method, a dispenser method, any printing method such as gravure printing or screen printing, a droplet discharging method, or the like can be used to form the conductive layer 343 serving as an antenna.

Each of the transistors 310*a*, 310*b*, 310*c*, and 310*d* included in the element forming layer 335 can be provided by a p-channel TFT or an n-channel TFT, or a CMOS circuit combining a p-channel TFT and an n-channel TFT. Further, any structure may be used for a semiconductor layer included in the transistors 310*a*, 310*b*, 310*c*, and 310*d*. For example, an impurity region (including a source region, a drain region, and an LDD region) may be formed, and either a p-channel type or an n-channel type may be employed. An insulating layer (sidewall) may be formed to be in contact with a side face of the gate electrode, or a silicide layer may be formed for either or both of source and drain regions and the gate electrode. As a material for the silicide layer, nickel, tungsten, molybdenum, cobalt, platinum, or the like can be used.

Each of the transistors 310*a*, 310*b*, 310*c*, and 310*d* included in the element forming layer 335 may be provided using an organic transistor in which a semiconductor layer forming the transistors is formed of an organic compound. In this case, the element forming layer 335 including the organic transistor can be formed by using a direct printing method, a dispenser method, a droplet discharging method, or the like over the substrate 300 that is a flexible substrate such as a plastic substrate. By using a printing method, a droplet discharging method, or the like, a semiconductor device can be manufactured at low cost.

Further, the element forming layer 335, the memory elements 315*a*, and 315*b*, and the conductive layer 343 serving as an antenna can be formed by an evaporation method, sputtering, a CVD method, a dispenser method, a printing method, a droplet discharging method or the like as described above. It is to be noted that different methods may be employed to form different parts. For example, in order to obtain a transistor requiring high-speed operation, a semiconductor layer formed of Si or the like is provided over a substrate and crystallized by a heat treatment, and then, a transistor serving as a switching element can be provided as an organic transistor in the upper side of a element forming layer by using a dispenser method, a printing method, or a droplet discharging method.

It is to be noted that a sensor connecting to the transistor may be provided. As the sensor, an element for detecting properties such as temperature, humidity, illuminance, gas, gravity, pressure, sound (vibration), and acceleration by a physical means or a chemical means can be cited. The sensor can be formed by a semiconductor element such as a resistance element, a capacitive coupling element, an inductive coupling element, a photovoltaic element, a photoelectric conversion element, a thermoelectromotive force element, a transistor, a thermistor, or a diode.

Next, an example of a structure of a semiconductor device will be described with reference to FIG. 11, in the case where the semiconductor device is provided by providing a terminal portion over a substrate provided with plurality of elements and memory elements to connect with an antenna provided over another substrate.

Figure 11:
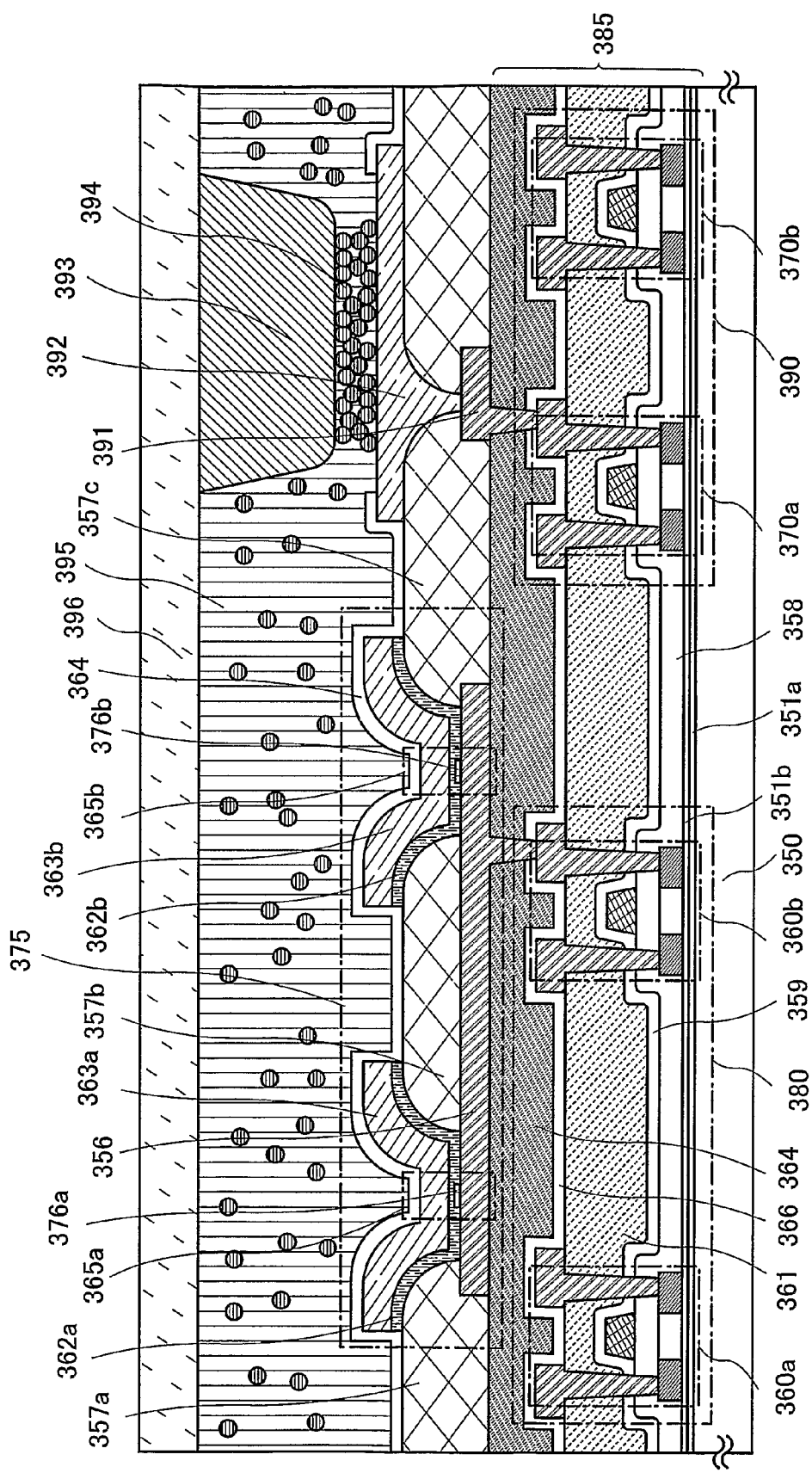
FIG. 11 is a view describing a semiconductor device according to the present invention.

FIG. 11 shows a semiconductor device including a memory device that has a passive matrix structure. An element forming layer 385 is provided over a substrate 350, and a memory element portion 375 is provided over the element forming layer 385. A conductive layer 393 serving as an antenna is provided over a substrate 396 to connect to the element forming layer 385. Here, the case in which the memory element portion 375 or the conductive layer 393 serving as an antenna is provide in the upper side of the element forming layer, is shown; however, the present invention is not limited to this structure. It is possible that the memory element portion 375 is provided in the lower side of the element forming layer 385 or in the same layer thereof. Alternatively, it is also possible that the conductive layer 393 serving as an antenna is provided in the lower side of the element forming layer 385.

In FIG. 11, the element forming layer 385, which includes a transistor part 380 having transistors 360a and 360b; a transistor part 390 having transistors 370a and 370b; and insulating layers 351a, 351b, 358, 359, 361, 366, and 364, are provided over a substrate 350.

The memory element portion 375 is formed using memory elements 365a and 365b. The memory element 365a is formed by stacking a partition wall (insulating layer) 375a, a partition wall (insulating layer) 375b, an insulating layer 362a and a second conductive layer 363a over a first conductive layer 356. The memory element 365b is formed by stacking the partition wall (insulating layer) 357b, a partition wall (insulating layer) 357c, an insulating layer 362b, and a second conductive layer 363b over the first conductive layer 356. Further, an insulating layer 364 serving as a protective film is formed to cover the second conductive layers 363a and 363b. In addition, the first conductive layer 356 over which a plurality of memory elements 365a and 365b are formed is connected to a source electrode layer or a drain electrode layer of the only transistor 360b. In other words, the memory elements are connected to the one same transistor. The partition walls (insulating layers) 357a, 357b, and 357c are provided between each memory cell to isolate the insulating layers. However, when influence of electric field in lateral directions between each adjacent memory cell is not concerned, the insulating layers 362a and 362b may be formed over the entire surface of the first conductive layer 356. It is to be noted that the memory elements 365a and 365b can be formed with the use of the material or the manufacturing method described the above embodiment mode. Liquid-repellent layers 376a and 376b that each become to a low wettability region, are formed over the first conductive layer 356, and the surface of the first conductive layer 356 has different wettability regions.

In the memory elements 365a and 365b, surfaces of the liquid-repellent layers 376a and 376b have lower wettability with respect to a composition having fluidity of a material for forming the insulating layers 362a and 362b than that of the peripheral first conductive layer 356. Therefore, the composition having fluidity of a material for forming the insulating layers 362a and 362b transfers from the liquid-repellent layers 376a and 376b, and a film thickness of the insulating layers 362a and 362b are uneven to cause short-circuit of the memory elements 365a and 365b.

The substrate including the element forming layer 385 and the memory element portion 375 is attached to the substrate 396 provided with the conductive layer 393 serving as an antenna with an adhesive resin 395. Here, the conductive layer 393 is provided over a conductive layer 391 that is formed of the same layer with the first conductive layer 356, and a conductive layer 392 that is formed of the same layer with the second conductive layers 363a and 363b. Further, the conductive layer 391 is connected to a source electrode layer or a drain electrode layer of the transistor 370a. The element forming layer 385 and the conductive layer 393 are electrically connected to each other through conductive fine particles 394 contained in the resin 395. Alternatively, the substrate including the element forming layer 385 and the memory element portion 375 may be attached to the substrate 396 provided with the conductive layer 393 serving as an antenna with a conductive adhesive such as silver paste, copper paste, or carbon paste, or by solder bonding.

Thus, a semiconductor device provided with a memory device and an antenna can be formed. In addition, in the present embodiment mode, an element forming layer can be provided by forming a thin film transistor over a substrate. Alternatively, a semiconductor substrate such as a Si substrate is used as a substrate, and an element forming layer may be provided by forming a filed effect transistor over the substrate. Furthermore, an SOI substrate may be used as a substrate and an element forming layer may be provided thereover. In this case, the SOI substrate may be formed by attaching wafers or by using a method called SIMOX in which an insulating layer is formed inside a substrate by implanting oxygen ions into a Si substrate.

In addition, a memory element portion may be provided over a substrate provided with a conductive layer serving as an antenna. Further, a sensor connecting to a transistor may be provided.

It is to be noted that the present embodiment can be freely combined with the above embodiment modes. Further, the semiconductor device manufactured in the present embodiment is separated from the substrate by a separation step and is attached to a flexible substrate to be provided over a flexible substratum. Then, a semiconductor device having flexibility can be obtained. The flexible substratum corresponds to a film made of polypropylene, polyester, vinyl, polyvinyl fluoride, polyvinyl chloride, or the like, paper made from a fibrous material, a stacked film of a base film (polyester, polyamide, an inorganic vapor deposition film, paper, or the like) and an adhesive synthetic resin film (an acrylic-based synthetic resin, an epoxy-based synthetic resin, or the like), or the like. The films are subjected to a heat treatment and a pressure treatment by thermocompression bonding. An adhesive layer that is provided on the outermost surface of the layer, or a layer (not an adhesive layer) that is provided on the outermost layer thereof, is melted by a heart treatment, and then is pressured, so that the films are attached. An adhesive layer may be provided on the substratum or it may not be provided. The adhesive layer corresponds to a layer containing an adhesive such as a heat curable resin, an ultraviolet-curable resin, an epoxy resin-based adhesive, or a resin additive.

In accordance with the memory element according to the present invention, it is possible to reduce the driving voltage at the time of writing data. As a result, a memory device and a semiconductor device with low power consumption can be provided at low cost with high yield.

Embodiment Mode 4

In the present embodiment mode, writing or reading data in the semiconductor device having the above structure will be described.

Writing data into the semiconductor device having the above structure can be performed by adding optical action or electric action. First, the case of writing data by adding electric action will be described (see FIGS. 2B and 3).

When writing data is performed by adding electric action, one of the memory cells 721 is selected by the row decoder 724a, the column decoder 726a, and the selector 726c, and then, data is written into the memory cell 721 with the use of a writing circuit. Specifically, large voltage is selectively applied to the insulating layer 752 in a desired portion, and a large amount of current is fed so that short-circuit is caused between the first conductive layer 751b and the second conductive layer 753b.

Electric resistance of the short-circuited portion is largely decreased compared to that of the other portions. Thus, by adding the electric action, writing data is performed by utilizing a change in the electric resistance between the two conductive layers. For example, in the case where an insulating layer to which the electric action is not added, is used as data "0", when writing data "1", large voltage is selectively applied to the insulating layer in a desired portion, and a large amount of current is fed to cause short-circuit and to decrease the electric resistance.

Next, the case of writing data by adding optical action will be described (see FIGS. 8A to 8C).

In the case of writing data by adding optical action, an insulating layer 752 is irradiated with laser light from a conductive layer side where the conductive layer has a light transmitting property (here, a second conductive layers 753a, 753b and 753c)(see FIG. 8A). Here, the insulating layer 752 in a desired portion is selectively irradiated with laser light to destroy the insulating layer 752(see FIG. 8B). The destroyed insulating layer is carbonized and insulated; therefore, the electric resistance is significantly increased compared with that of other portions. Thus, writing data is performed by utilizing the phenomenon that electric resistance of the insulating layer 752 is changed. For example, in the case where an insulating layer that is not irradiated with laser light is used for "0", when writing data "1", an insulating layer in a desired portion is selectively irradiated with laser light and destroyed to increase the electric resistance.

In the case of writing data, resistance value of a memory element may be changed before and after writing. Therefore, change of the resistance value of the memory element may be generated in any methods such as optical action or electric action. For example, the first and second conductive layers are transformed and the first and second conductive layers approach each other in the memory element because of energy (heat or the like) by irradiation of light. The insulating layer is transformed with the change and the resistant value may be changed.

In the case of laser light irradiation, the change of electric resistance of the insulating layer 752 depends on the size of a memory cell 721; however, the change is realized by irradiation with laser light focused to a diameter of a beam spot of micrometer size or nanometer size with the use of an optical system such as a lens. For example, when a laser beam having a diameter of 1 μm passes at a linear velocity of 10 m/sec, the period of irradiating the insulating layer included in one memory cell 721 with laser light is 100 nsec. In order to change the phase within time as short as 100 nsec, the laser power is preferably 10 mW and the power density is preferably 10 kW/mm². When the insulating layer is selectively irradiated with laser light, it is preferable to use a pulsed laser irradiation device.

Here, an example of a laser irradiation device will be described with reference to FIG. 8C. A laser irradiation device 1001 is provided with a computer 1002 (hereinafter, referred to as PC) for conducting various controls when laser light is emitted; a laser oscillator 1003 for emitting laser light; a power supply 1004 of the laser oscillator 1003; an optical system (ND filter) 1005 for attenuating the laser light; an acousto-optic modulator (AOM) 1006 for modulating the intensity of the laser light; an optical system 1007 including a lens for reducing the area of the cross section of the laser light, a mirror for changing a light path, and the like; a transfer mechanism 1009 having an X axis stage and a Y axis stage; a D/A converter 1010 for converting control data outputted from the PC from a digital one to an analog one; a driver 1011 for controlling the acousto-optic modulator 1006 in accordance with the analog voltage outputted from the D/A converter; a driver 1012 for outputting a driving signal for driving the transfer mechanism 1009; and an autofocusing mechanism 1013 for focusing laser light on an object to be irradiated.

A laser oscillator that can emit ultraviolet light, visible light, or infrared light can be used as the laser oscillator 1003. An excimer laser oscillator using KrF, ArF, XeCl, Xe, or the like; a gas laser oscillator using He, He—Cd, Ar, He—Ne, HF, or the like; a solid-state laser oscillator using a crystal such as YAG, GdVO$_4$, YVO$_4$, YLF, or YAlO$_3$ doped with Cr, Nd, Er, Ho, Ce, Co, Ti, or Tm; or a semiconductor laser oscillator using GaN, GaAs, GaAlAs, InGaAsP, or the like can be used as the laser oscillator. It is to be noted that a fundamental wave or a second harmonic to a fifth harmonic is preferably applied to a solid-state laser oscillator.

Next, an irradiation method using the laser irradiation device will be described. When a substrate 750 provided with the insulating layer 752 is set on the transfer mechanism 1009, the PC 1002 detects a position of the insulating layer 752 that is to be irradiated with laser light by a camera that is not shown in the figures. Then, the PC 1002 generates movement data for moving the transfer mechanism 1009 based on the detected position data.

Thereafter, the PC 1002 controls the amount of light which is to be emitted from the acousto-optic modulator 1006 through the driver 1011; thus, laser light emitted from the laser oscillator 1003 is attenuated by the optical system 1005. Then, the amount of light is controlled by the acousto-optic modulator 1006 so as to obtain a predetermined amount of light. Meanwhile, the light path and the shape of a beam spot of the laser light outputted from the acousto-optic modulator 1006 are changed with the optical system 1007 and the laser light is collected by the lens. Then, the substrate 750 is irradiated with the laser light.

At this time, the transfer mechanism 1009 is controlled to move in an X direction and a Y direction in accordance with the movement data generated by the PC 1002. As a result, a predetermined position is irradiated with the laser light, and the light energy density of the laser light is converted to heat energy. Thus, the insulating layer provided over the substrate 750 can be selectively irradiated with laser light. It is to be noted that laser light irradiation is performed by moving the transfer mechanism 1009; however, laser light may be moved to an X direction and a Y direction by adjusting the optical system 1007.

Figure 9:
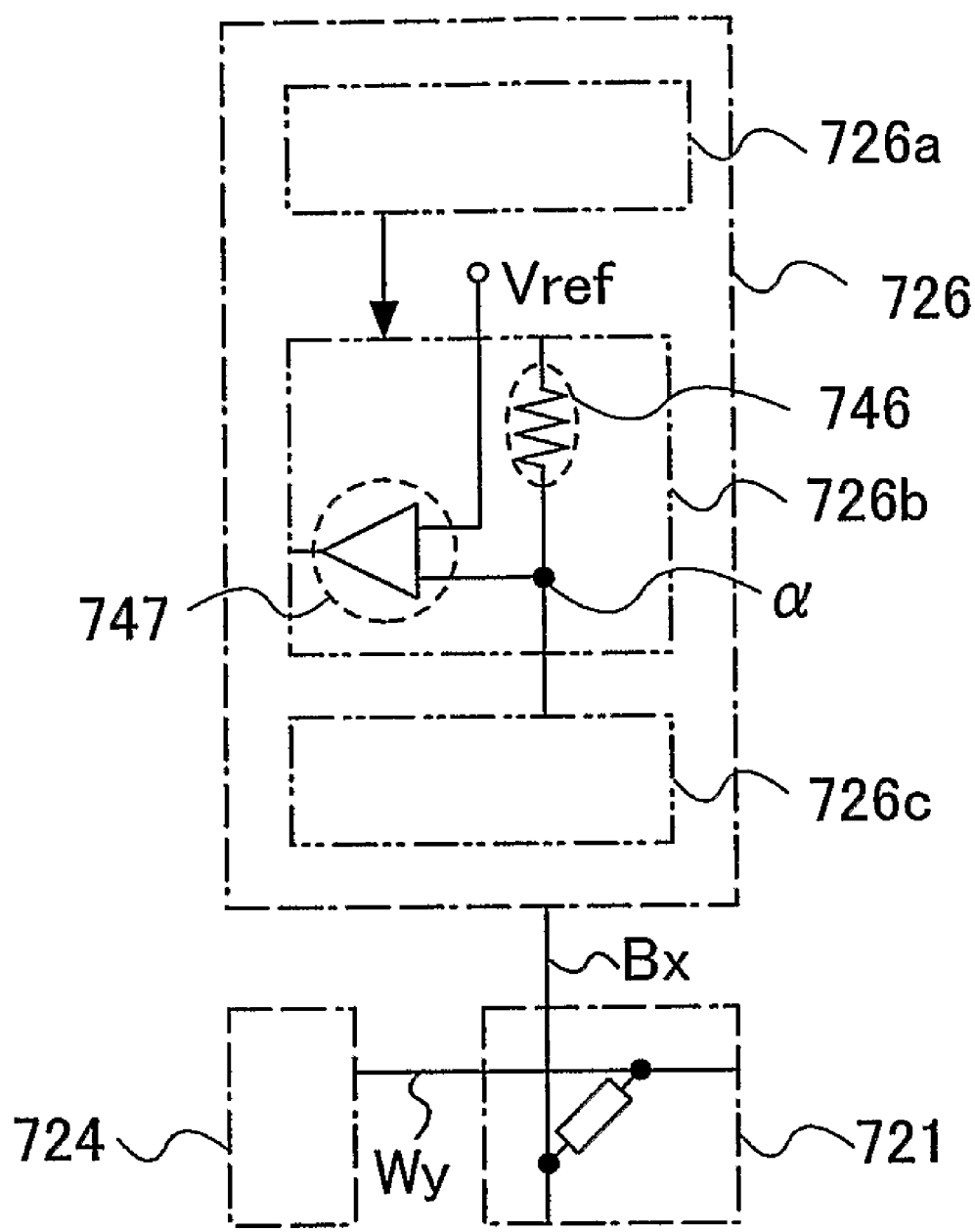
FIG. 9 is a diagram describing a memory device according to the present invention.

Subsequently, operation in the case of reading data from a memory element will be described (see FIG. 9). Here, a reading circuit 726b includes a resistance element 746 and a sense amplifier 747. However, the reading circuit 726*b* is not limited to the above structure, and the reading circuit may have any structure.

Reading data is performed by applying voltage between a first conductive layer 751*b* and each of second conductive layers 753*a*, 753*b* and 753*c* to read an electric resistance value of an insulating layer 752. For example, in the case of writing the data by applying an electric action as described above, resistance value Ra1 in the case where the electric action is not added, and resistance value Rb1 in the case where the electric value is added so that short-circuit is caused between the two conductive layers, fulfill Ra1>Rb1. Reading data is performed by electrically reading such a difference in the resistance value.

Further, when writing data is performed by irradiating the insulating layer with the laser light as described above, resistance value Ra2 in the case where the insulating layer is not irradiated with the laser light, and resistance value Rb2 in the case where the insulating layer is irradiated with the laser to be destroyed, fulfill Ra2<Rb2. Reading data is performed by electrically reading such a difference in the resistance value.

For example, data of a memory cell 721 disposed in an x-th column and a y-th row is read among the plurality of memory cells 721 included in a memory cell array 722. In that case, first, a bit line Bx in the x-th column and a word line Wy in the y-th row are selected by a row decoder 724*a*, a column decoder 726*a*, and a selector 726*c*. Then, the insulating layer included in the memory cell 721 and a resistance element 746 are in such a state that they are connected in series. Thus, voltage is applied to the opposite ends of the two connected resistance elements in series, the electric potential of a node a becomes a resistance-divided electric potential in accordance with the resistance value Ra or Rb of the insulating layer 752. The electric potential of the node a is supplied to a sense amplifier 747. In the sense amplifier 747, which of the information "0" and "1" is contained is judged. After that, a signal containing the information "0" or "1" judged by the sense amplifier 747 is supplied to the outside.

In accordance with the above method, the state of the electric resistance in the insulating layer is read by voltage value utilizing the difference in the resistance value and the resistance division. However, a method in which current values are compared may be employed. This method, for example, utilizes that current value Ia1 in the case where the electric action is not added to the insulating layer, and resistance value Ib1 in the case where the electric action is added to the insulating layer so that short-circuit is caused between the two conductive layers is short-circuited, fulfill Ia1<Ib1. Further, in the case of writing data is performed by irradiating the insulating layer with laser light, current value Ia2 in the case where the insulating layer is not irradiated with the laser light, and current value Ib2 in the case where the insulating layer is irradiated with the laser light to be destroyed, fulfill Ia2>Ib2. Thus, reading data may be performed by electrically reading such a difference in the current value.

Since a memory element having the above structure and a semiconductor device provided with the memory element are nonvolatile memories, an electric battery for storing data is not required to be mounted. A small-sized, thin, and lightweight semiconductor device can be provided. Further, by using the insulating material that is used in the above embodiment mode as an insulating layer, rewriting data cannot be performed though writing data (additionally) is possible. Accordingly, counterfeits can be prevented and a semiconductor device with ensured security can be provided.

It is to be noted that a memory element having a passive matrix structure of which a memory circuit is a simple and a semiconductor device provided with the memory element have been taken as examples in the present embodiment mode. However, even in the case of using a memory circuit having an active matrix structure, data can be written or read in a similar manner.

Here, in the case of an active matrix structure, a specific example of reading data in a memory element by electric action will be described with reference to FIGS. 14A and 14B.

Figure 14A:
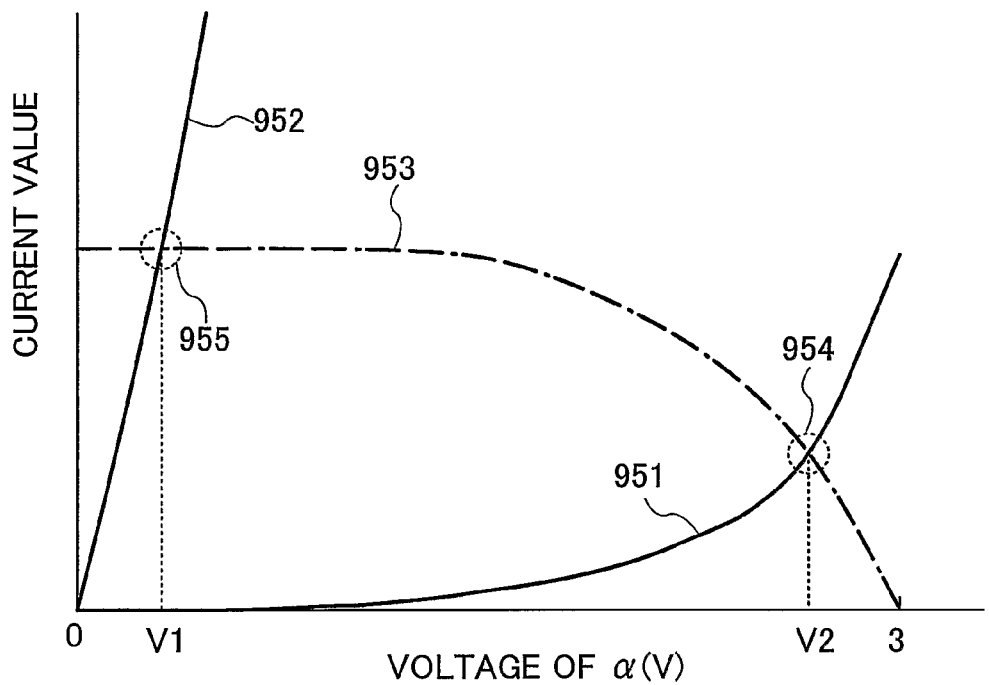
FIGS. 14A and 14B are a graph showing current-voltage characteristics and a diagram of a memory device according to the present invention.
Figure 14B:
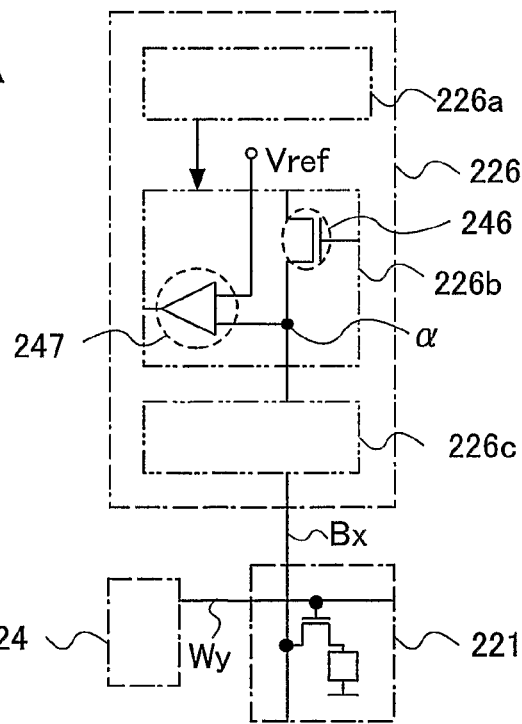

FIGS. 14A and 14B show current-voltage characteristics 951 of a memory element portion in which data "0" is written, current-voltage characteristics 952 of a memory element portion in which data "1" is written, and current-voltage characteristics 953 of a resistance element 246. Here, the case of using a transistor as the resistance element 246 is shown (see FIG. 14B). In addition, the case of applying 3 V between a first conductive layer and a second conductive layer as operation voltage in reading data will be described.

In FIGS. 14A and 14B, as for a memory cell having a memory element portion in which data "0" is written, an intersection point 954 of the current-voltage characteristics 951 of the memory element portion and the current-voltage characteristics 953 of the transistor is an operational point, and potential of a node α at this time is V1 (V). The potential of the node α is supplied to a sense amplifier 247. The data stored in the memory cell is recognized as "0" in the sense amplifier 247.

Meanwhile, as for a memory cell having a memory element portion in which data "1" is written, an intersection point 955 of the current-voltage characteristics 952 of the memory element portion and the current-voltage characteristics 953 of the transistor is an operational point, and the potential of a node α at this time is V2 (V) (V1>V2). The potential of the node cc is supplied to the sense amplifier 247. The data stored in the memory cell is recognized as "1" in the sense amplifier 247.

Thus, the data stored in the memory cell is distinguished by reading the potential divided by resistance in accordance with the resistance value of a memory element portion 241.

It is to be noted that the present embodiment mode can be freely combined with any structures of the memory element and the semiconductor device provided with the memory element shown in the above embodiment mode.

Embodiment Mode 5

Figure 12A:
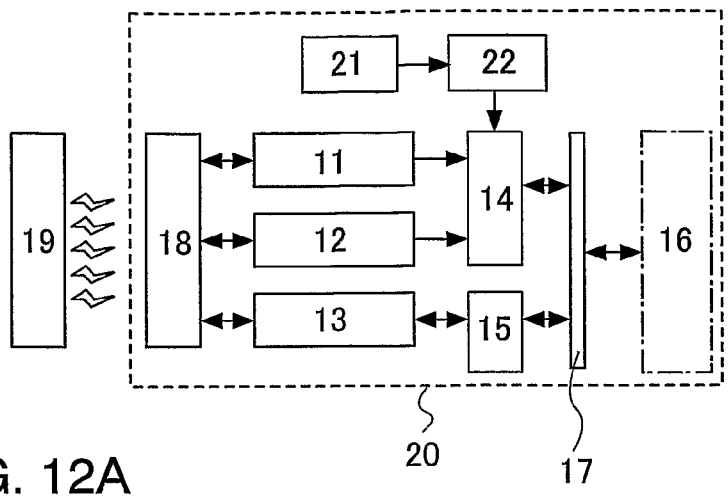
FIGS. 12A and 12B are diagrams describing a method for manufacturing a semiconductor device according to the present invention.

A structure of a semiconductor device according to the present embodiment mode will be described with reference to FIG. 12A. As shown in FIG. 12A, a semiconductor device 20 of the present invention has a function of communicating data without contact, and includes a power supply circuit 11, a clock generation circuit 12, a data demodulation/modulation circuit 13, a control circuit 14 for controlling other circuits, an interface circuit 15, a memory circuit 16, a data bus 17, an antenna (antenna coil) 18, a sensor 21, and a sensor circuit 22.

In the power supply circuit 11, various kinds of power supplies, which are supplied to each circuit in the semiconductor device 20, are generated in accordance with an alternating current signal inputted from the antenna 18. In the clock generation circuit 12, various kinds of clock signals, which are supplied to each circuit in the semiconductor device 20, are generated in accordance with an alternative current signal inputted from the antenna 18: The data demodulation/modulation circuit 13 has a function of demodulating/modulating data communicated with a reader/writer 19. The controlling circuit 14 has a function of controlling the memory circuit 16. The antenna 18 has a function of transmitting/receiving electromagnetic fields or electric waves. The reader/writer 19 communicates with and controls the semiconductor device, and controls a process with regard to the data of the semiconductor device. It is to be noted that the structure of the semiconductor device is not limited to the above structure, for example, other element such as a limiter circuit of a power supply voltage and hard ware dedicated to encryption may be additionally provided.

The memory circuit 16 has a memory element where an insulating layer or a phase change layer is interposed between a pair of conductive layers. It is to be noted that the memory circuit 16 may have only the memory element where an insulating layer or a phase change layer is interposed between a pair of conductive layers, or may have another memory circuit with a different structure. The memory circuit with a different structure corresponds, for example, to one or more selected from a DRAM, an SRAM, an FeRAM, a mask ROM, a PROM, an EPROM, an EEPROM, and a flash memory.

The sensor 21 is formed using a semiconductor element such as a resistance element, a capacitive coupling element, an inductive coupling element, a photovoltaic element, a photoelectric conversion element, a thermal electromotive force element, a transistor, a thermistor, and a diode. The sensor circuit 22 detects changes in impedance, reactance, inductance, voltage, or current, and performs analog/digital (A/D) conversion to output a signal to the control circuit 14.

Embodiment Mode 6

In accordance with the present invention, a semiconductor device serving as a processor chip (also referred to as a wireless chip, a wireless processor, a wireless memory, and a wireless tag) can be formed. The usage of the semiconductor device of the present invention is wide-ranging. For example, the semiconductor device can be used by being provided on paper money, coin, securities, certificates, bearer bonds, packing containers, documents, recording medium, personal belongings, vehicles, foods, garments, health articles, livingwares, medicines, electronic apparatuses, and the like.

Figure 13A:
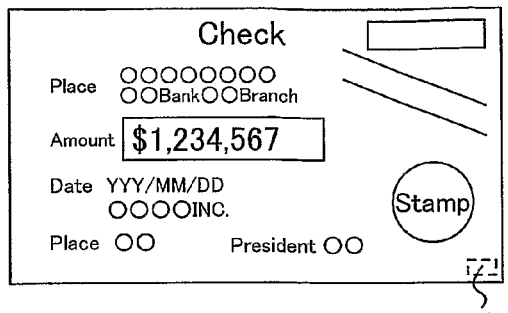
FIGS. 13A to 13G are views s describing a semiconductor device according to the present invention.
Figure 13B:
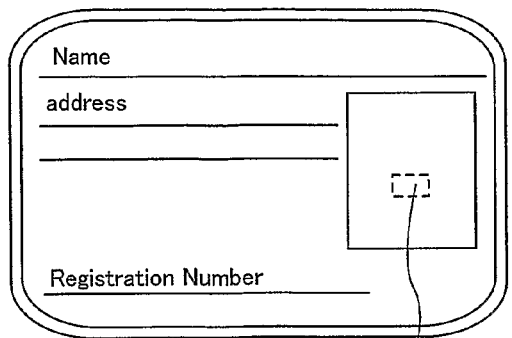
Figure 13C:
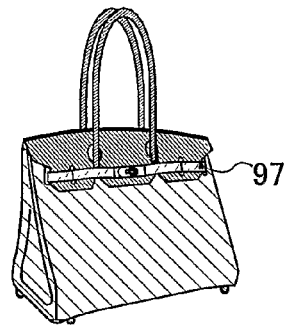
Figure 13D:
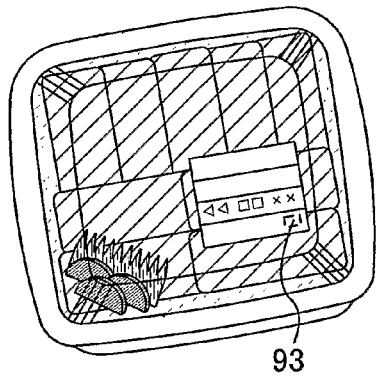
Figure 13E:
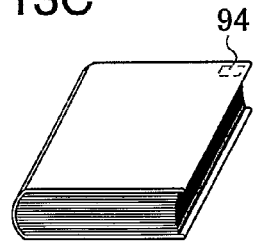
Figure 13F:
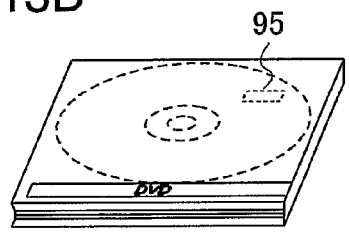
Figure 13G:
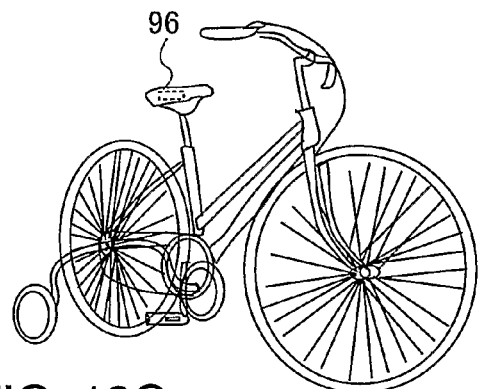

The paper money and coins are money distributed in the market and include currency (cash vouchers) available in a certain area in a similar way to money, and memorial coins and the like. The securities refer to checks, stock certificates, promissory notes, and the like, which can be provided with a processor chip 90 (see FIG. 13A). The certificates refer to driver's licenses, certificates of residence, and the like, which can be provided with a processor chip 91 (see FIG. 13B). The personal belongings refer to a bag, a pair of glasses, and the like, which can be provided with a processor chip 97 (see FIG. 13C). The bearer bonds refer to stamps, rice coupons, various merchandise coupons, and the like. The packing containers refer to wrapping paper for a box lunch, plastic bottles, and the like, which can be provided with a processor chip 93 (see FIG. 13D). The documents refer to volumes, books and the like, which can be provided with a processor chip 94 (see FIG. 13E). The recording medium refer to DVD software, video tapes, and the like, which can be provided with a processor chip 95 (see FIG. 13F). The vehicles refer to wheeled vehicles such as bicycles, vessels, and the like, which can be provided with a processor chip 96 (FIG. 13G). The foods refer to eatables, drinks, and the like. The garments refer to clothes, chaussures, and the like. The health articles refer to medical appliances, health appliances, and the like. The livingwares refer to furniture, lighting equipment, and the like. The medicines refer to medical products, pesticides, and the like. The electronic apparatuses refer to liquid crystal display apparatuses, EL display apparatuses, television apparatuses (TV sets or flat-screen televisions), cellular phones, and the like.

The semiconductor device according to the present invention is fixed to products by mounting the device onto a print substrate, pasting the device to the surface, or embedding the device in the products. For example, the semiconductor device is embedded in a paper of a book or in organic resin of a package made from the organic resin. Since the semiconductor device according to the present invention is realized to be small, thin, and lightweight, design of a product is not detracted after fixating the semiconductor device to the product. A certification function can be provided by providing the semiconductor device to the paper money, the coins, the securities, the bearer bonds, the certificates, and the like. A counterfeit can be prevented by employing the certification function. The efficiency in an inspection system can be promoted by providing the semiconductor device to the packing containers, the recording medium, the personal belongings, the foods, the garments, the livingwares, the electronic apparatuses, and the like.

Figure 12B:
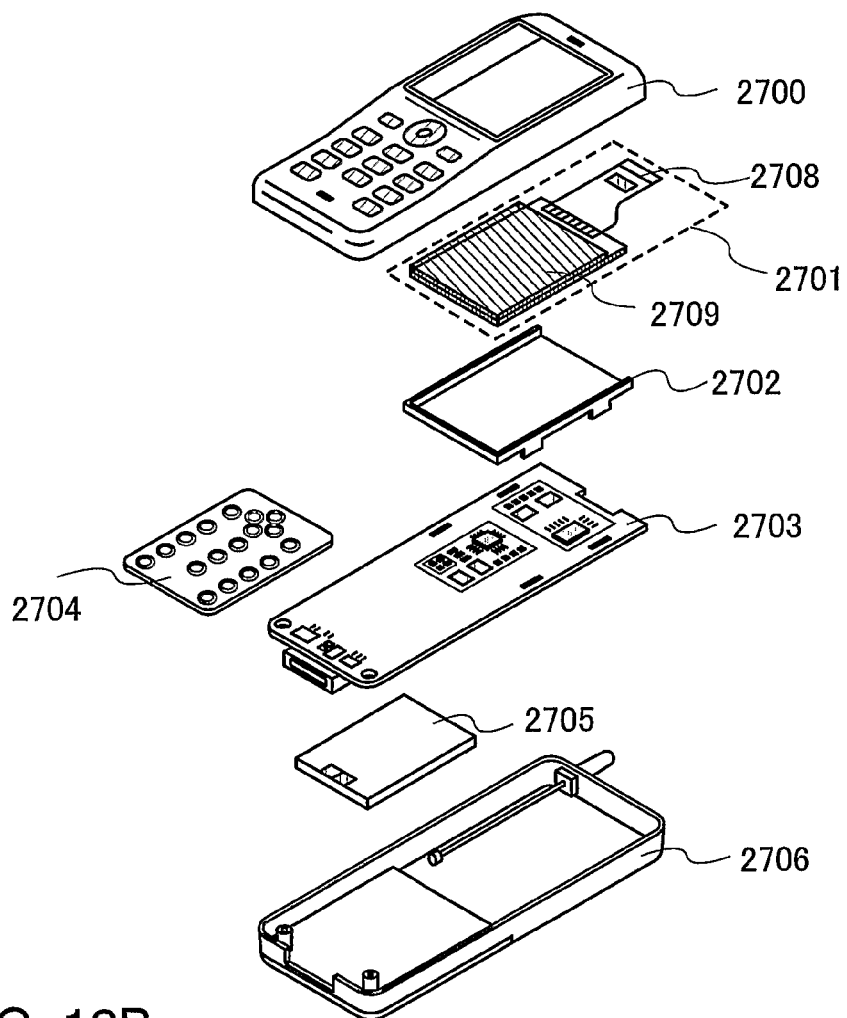

Next, a mode of an electronic apparatus where the semiconductor device of the present invention is mounted is described with reference to the drawings. The electronic apparatus shown here is a cellular phone including frame bodies 2700 and 2706, a panel 2701, a housing 2702, a print wiring substrate 2703, operation switches 2704, and a battery 2705 (see FIG. 12B). The panel 2701 is detachably incorporated in the housing 2702. The housing 2702 is fitted into the print wiring substrate 2703. A shape and dimension of the housing 2702 are appropriately changed in accordance with the electronic apparatus where the panel 2701 is to be incorporated. Over the print wiring substrate 2703, a plurality of packaged semiconductor devices are mounted and the semiconductor device of the present invention can be used as one of the plurality of packaged semiconductor devices. The plurality of semiconductor devices mounted onto the print wiring substrate 2703 has any one of functions of a controller, a central processing unit (CPU), a memory, a power source circuit, an audio processing circuit, a transmitting/receiving circuit, and the like.

The panel 2701 is connected with the print wiring substrate 2703 through a connection film 2708. The above panel 2701, the housing 2702, and the print wiring substrate 2703 are placed in the frame bodies 2700 and 2706 together with the operation switches 2704 and the battery 2705. A pixel region 2709 in the panel 2701 is provided so as to be observed through an opening window provided in the frame body 2700.

As described above, the semiconductor device according to the present invention is small, thin, and lightweight, whereby the limited space in the frame bodies 2700 and 2706 of the electric apparatus can be efficiency used.

In addition, since the semiconductor device according to the present invention includes a memory element having a simple structure in which an insulating layer is interposed between a pair of conductive layers, an electric apparatus using an inexpensive semiconductor device can be provided. Further, since high integration is easy with the semiconductor device of the present invention, an electric apparatus using a semiconductor device including a high-capacity memory circuit can be provided.

In addition, a memory device in the semiconductor device according to the present invention is nonvolatile and additionally recordable, and the data is written in the memory device by optical action or electric action. With this characteristic, the forgery due to the rewriting can be prevented and new data can be additionally written. Therefore, an electric apparatus using a sophisticated and high-value-added semiconductor device can be provided.

It is to be noted that the frame bodies 2700 and 2706 are shown as an example of an exterior of the mobile phone, and the electric apparatus according to the present embodiment mode can be changed variously in accordance with the function or the intended purpose thereof.

Embodiment Mode 7

In the present embodiment mode, reading or writing data in a semiconductor device having the above structure will be described.

FIG. 20 shows an example of a structure of a semiconductor device according to the present invention. The semiconductor device includes a memory cell array 1722 in which memory cells 1721 are arranged in matrix, a circuit 1726 having reading and writing circuits, a decoder 1724, and a decoder 1723. It is to be noted that the structure shown here is only an example, and a semiconductor device may include another circuit such as a sense amplifier, an output circuit, a buffer, and an interface that communicates with outside.

The memory cell 1721 includes a first conductive layer that is connected to a bit line Bx (1≦x≦m), a second conductive layer that is connected to a word line Wy (1≦y≦n), and an insulating layer. The insulating layer has a single layer structure or a stacked layers structure between the first conductive layer and the second conductive layer.

Figure 20A:
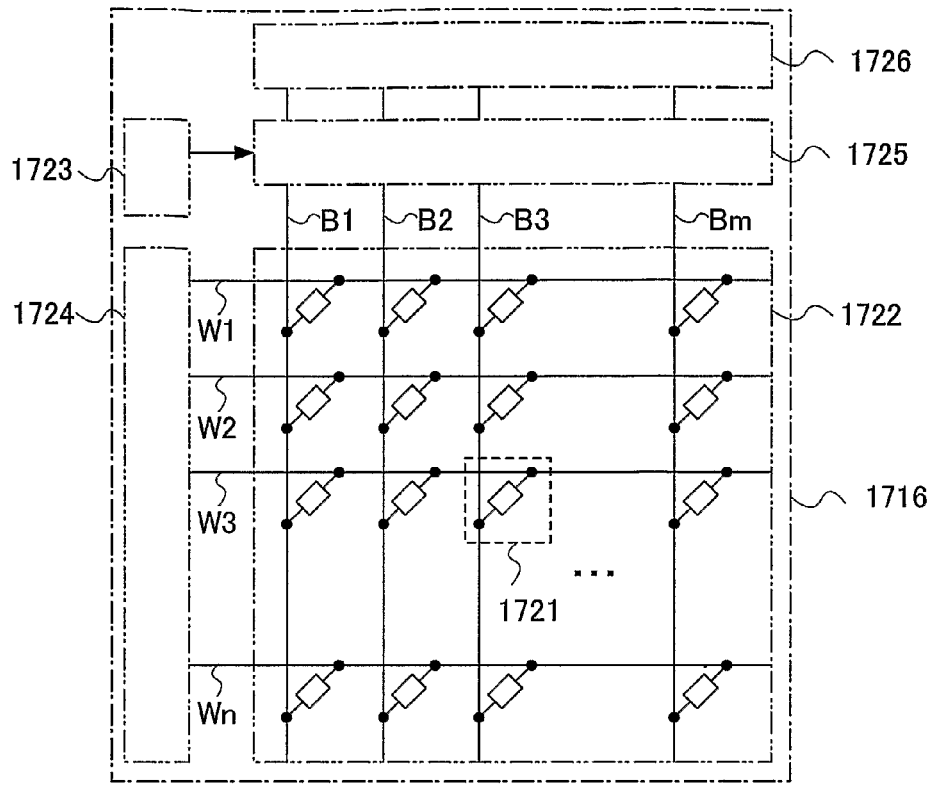
FIGS. 20A to 20C are diagrams describing a memory device according to the present invention.
Figures 20B, 20C:
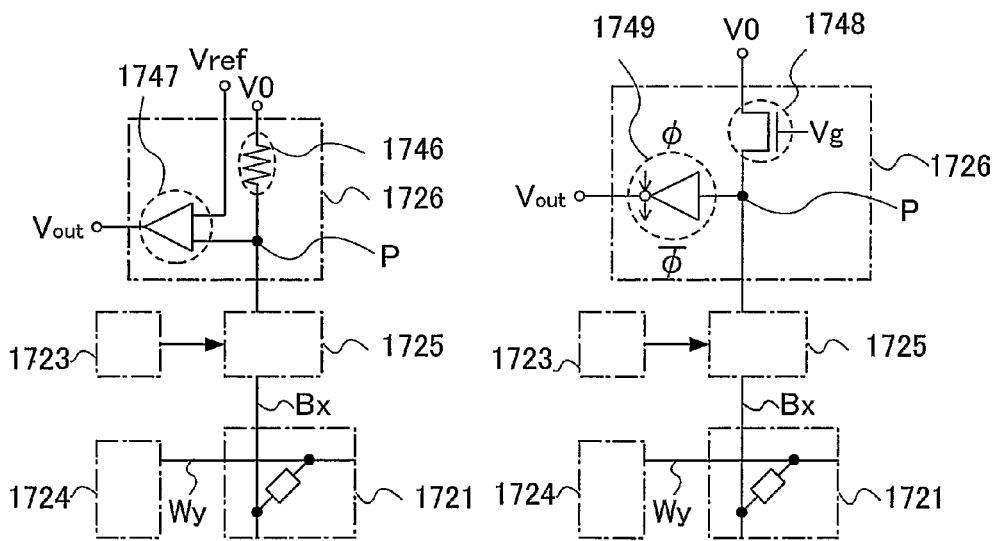

First, operation of writing data into a memory element in a memory device having a passive matrix structure is described with references to FIGS. 20A to 20C. Data is written by optical action or electric action. First, the case of writing data by electric action is described. Writing is performed by changing electric characteristics of a memory cell, and an initial state (state without electric action) of the memory cell is used as data "0" and a state in which electric characteristics is changed is used as data "1".

In the case of writing data "1" into the memory cell 1721, the memory cell 1721 is selected first by the decoders 1723 and 1724 and a selector 1725. Specifically, a predetermined voltage V2 is applied to a word line W3 connected to the memory cell 1721 by the decoder 1724. A bit line B3 connected to the memory cell 1721 is connected to a circuit 1726 by the decoder 1723 and the selector 1725. Then, a writing voltage V1 is outputted from the circuit 1726 to the bit line B3. Thus, an electric potential Vw=V1−V2 is applied between the first conductive layer and the second conductive layer included in the memory cell 1721. By selecting an appropriate electric potential Vw, the insulating layer provided between the conductive layers is changed physically or electrically to write data "1". Specifically, at a reading operation voltage, electric resistance between the first conductive layer and second conductive layer in the state of data "1" may be changed so as to be drastically lowered compared with the electric resistance in the state of data "0". For example, the voltage may be appropriately selected from the range of (V1, V2)=(0 V, 5 V to 15 V) or (3 V to 5 V, −12 V to −2 V). The electric potential Vw may be 5V to 15V or −5V to −15V.

A non-selected word line and a non-selected bit line are controlled so that data "1" is not written into the memory cell that is to be connected to the non-selected word line and the non-selected bit line. For example, the non-selected word line and the non-selected bit line may be in a floating state. Characteristics that can ensure selectivity such as diode characteristics are required between the first conductive layer and second conductive layer included in the memory cell.

On the other hand, in the case of writing data "0" into the memory cell 1721, electric action is not required to be applied to the memory cell 1721. In circuit operation, for example, the memory cell 1721 is selected by the decoders 1723 and 1724 and the selector 1725 in the same way as the case of writing data "1". Then, the output electric potential from the circuit 1726 to the bit line B3 may be set to be equivalent to an electric potential of a selected word line W3 or an electric potential of a non-selected word line, and such a voltage (for example, −5 V to 5 V) that does not change the electric characteristics of the memory cell 1721 may be applied between the first conductive layer and second conductive layer included in the memory cell 1721.

Next, the case of writing data by optical action will be described. In this case, the second conductive layer is required to transmit laser light. The insulating layer is irradiated with the laser light from a conductive layer side that has a light transmitting property. Here, the insulating layer in a desired portion is selectively irradiated with laser light to destroy the insulating layer. The destroyed insulating layer is insulated, and therefore, the electric resistance is significantly increased compared with another portion. Data is written by utilizing the phenomenon that the change in electric resistance between two conductive layers provided so as to interpose the insulating layer. For example, in the case where an insulating layer that is not irradiated with laser light is used for "0", when writing data "1", an insulating layer in a desired portion is selectively irradiated with laser light and destroyed to increase the electric resistance.

When an insulating layer formed with a conjugate polymer doped with a compound generating acid by absorbing light (photoacid generator) is irradiated with laser light, the irradiated portion has high conductivity while the non-irradiated portion does not have conductivity. Therefore, the data is written utilizing the change in the electric resistance of the insulating layer by selectively irradiating an insulating layer in a desired portion with laser light. For example, in the case where an insulating layer that is not irradiated with laser light is used for "0", when writing data "1", an insulating layer in a desired portion is selectively irradiated with laser light to increase the conductivity.

The structure of the present invention in which data is written by laser light irradiation makes it possible to manufacture a lot of memory devices easily. Thus, a memory device and a semiconductor device can be provided inexpensively.

Subsequently, operation of reading data from a memory element in a memory device having passive matrix structure will be described (see FIGS. 20A to 20C). Reading data is performed by utilizing electric characteristics between a first conductive layer and a second conductive layer included in a memory cell, which are different between a memory cell having data "0" and a memory cell having data "1". As an example, a reading method utilizing the difference in electric resistance will be described, where the effective electric resistance between a first conductive layer and a second conductive layer included in a memory cell (hereinafter also simply referred to as electric resistance of the memory cell) with data "0" is R0 at a reading voltage, and the electric resistance of a memory cell with data "1" is R1 at a reading voltage (R1<<R0). As for a reading/writing circuit, for example, a circuit 1726 using a resistance element 1746 and a differential amplifier 1747 shown in FIG. 20B can be conceivable as a structure of its reading portion. The resistance element 1746 has a resistance value Rr (R1<Rr<R0). A transistor 1748 may be used instead of the resistance element 1746 and a clocked inverter 1749 can be used instead of the differential amplifier (FIG. 20C). A signal φ or an inverted signal φ that is Hi when reading is performed and Lo when reading is not performed is inputted into the clocked inverter 1749. Naturally, the circuit configuration is not limited to FIGS. 20A to 20C.

In the case of reading data from the memory cell 1721, the memory cell 1721 is selected first by the decoders 1723 and 1724 and the selector 1725. Specifically, a predetermined voltage Vy is applied to a word line Wy connected to the memory cell 1721 by the decoder 1724. A bit line Bx connected to the memory cell 1721 is connected to a terminal P of the circuit 1726 by the decoder 1723 and the selector 1725. As a result, the electric potential Vp of the terminal P is a value determined by resistance division by a resistance element 1746 (resistance value: Rr) and the memory cell 1721 (resistance value: R0 or R1). Therefore, the equation Vp0=Vy+(V0−Vy)×R0/(R0+Rr) is made in the case where the memory cell 1721 has data "0". Alternatively, the equation Vp1=Vy+(V0−Vy)×R1/(R1+Rr) is made in the case where the memory cell 1721 has data "1". As a result, by selecting Vref so as to be between Vp0 and Vp1 in FIG. 20B or by selecting the change point of the clocked inverter between Vp0 and Vp1 in FIG. 20C, output electric potential Vout of Lo/Hi (or Hi/Lo) is outputted in accordance with data "0"/"1", so that reading can be performed.

For example, it is assumed that the differential amplifier is operated at Vdd=3 V, and Vy, V0, and Vref are 0 V, 3 V, and 1.5 V, respectively. On the condition of R0/Rr32 Rr/R1=9, Hi is outputted as Vout in accordance with Vp0=2.7 V when the memory cell has data "0", or Lo is outputted as Vout in accordance with Vp1=0.3 V when a memory cell has data "1". In this way, reading of a memory cell can be performed.

In accordance with the above method, the state of electric resistance of an insulating layer is read in a voltage value utilizing the difference in resistance value and resistance division. Naturally, the reading method is not limited thereto. For example, reading may be performed utilizing the different in current values other than utilizing the difference in electric resistant. In the case where electric characteristics of the memory cell have different diode characteristics between threshold voltages in the case of data "0" and data "1", reading may be performed utilizing the difference in the threshold voltage.

Next, operation of writing data into a memory element in a memory device having an active matrix structure will be described (see FIGS. 21A to 21C).

FIGS. 21A to 21C show an example of a structure of a memory device shown in the present embodiment mode. The memory device includes a memory cell array 1232 in which memory cells 1231 are arranged in matrix, a circuit 1226, a decoder 1224, and a decoder 1223. The circuit 1226 has a reading circuit and a writing circuit. It is to be noted that the structure of a memory device 1217 shown here is only an example, and a memory device may include another circuit such as a sense amplifier, an out put circuit, a buffer, and an interface that communicates with outside.

The memory cell array 1232 includes a first wiring connected to a bit line Bx (1≦x≦m), a second wiring connected to a word line Wy (1<y≦n), a transistor 1210*a*, a memory element 1215*b*, and a memory cell 1231. The memory element 1215*b* has a structure in which an insulating layer is interposed between a pair of conductive layers. A gate electrode of the transistor is connected to the word line. Either a source electrode or a drain electrode is connected to the bit line, and the other electrode is connected to one of two terminals included in the memory element. The other terminal of the memory element is connected to a common electrode (electric potential, Vcom).

First, operation of writing data by electric action will be described. It is to be noted that writing is performed by changing electric characteristics of the memory cell, and an initial state (state without electric action) of the memory cell is data "0" and a state in which electric characteristics is changed is data "1".

Here, the case of writing data into the memory cell 1231 in the n-th row and m-th column will be described. In the case of writing data "1" into the memory cell 1231, the memory cell 1231 is selected first by the decoders 1223 and 1224 and the selector 1225. Specifically, a predetermined voltage V22 is applied to a word line Wn connected to the memory cell 1231 by the decoder 1224. In addition, a bit line Bm connected to the memory cell 1231 is connected to the circuit 1226 having a reading circuit and a writing circuit by the decoder 1223 and the selector 1225. Then, a writing voltage V21 is outputted from the circuit 1226 into a bit line B3.

In this manner, a transistor 1210*a* included in the memory cell is turned on, and the memory element 1215*b* is electrically connected to the bit line to apply electric potential of approximately Vw=Vcom−V21. It is to be noted that one of electrodes of the memory element 1215*b* is connected to the common electrode of which electric potential is Vcom. An insulating layer provided between the conductive layers is changed physically or electrically by appropriately selecting electric potential Vw so that data "1" is written. Concretely, in a reading operation voltage, electric resistance between the first conductive layer and second conductive layer in the state of data "1" may be changed so as to be drastically lowered compared with the electric resistance in the state of data "0", or simply, short circuit may be caused. The voltage may be appropriately selected from the range of (V21, V22, Vcom)=(5 V to 15 V, 5 V to 15 V, 0 V) or (−12 V to 0 V, −12 V to 0 V, 3 V to 5 V). The electric potential Vw may be 5 V to 15 V or −5 V to −15 V.

A non-selected word line and a non-selected bit line are controlled so that data "1" is not written into a memory cell that is to be connected to each of the non-selected word line and the non-selected bit line. Specifically, an electric potential (for example, 0 V) for turning off the transistor in the memory cell that is to be connected may be applied to the non-selected word line, and the non-selected bit line may be in a floating state or an electric potential appropriately equivalent to Vcom may be applied to the non-selected bit line.

On the other hand, in the case of writing data "0" into the memory cell 1231, electric action is not required to be applied to the memory cell 1231. In circuit operation, for example, although the memory cell 1231 is selected by the decoders 1223 and 1224 and the selector 1225 in the same way as the case of writing data "1", an output electric potential from the circuit 1226 to the bit line B3 is set to be equivalent to Vcom or the bit line B3 is set to be in a floating state. As a result, a low electric potential (for example, −5 V to 5 V) or no electric potential is applied; therefore, electric characteristics do not change and writing data "0" is realized.

Subsequently, operation of writing data by optical action will be described. In this case, an insulating layer is irradiated with laser light from a conductive layer side, where the conductive layer has a light transmitting property by a laser irradiation device. A laser irradiation device that is the similar device described in the memory device that has a passive matrix structure with the use of FIGS. 8A to 8C may be used.

In the case of using an organic compound material for an insulating layer, the insulating layer is oxidized or carbonized to be insulated by laser irradiation. Then, resistance value of a memory element that is irradiated with laser light increases, whereas the resistance value of a memory element that is not irradiated with laser light does not change. When a conjugate polymer doped with photoacid generator is used as an insulating layer and irradiated with laser light, the insulating layer has conductivity. Therefore, a memory element that is irradiated with laser light has conductivity, whereas a memory element that is not irradiated with laser light has no conductivity.

Next, operation of reading data by electric action will be described. Here, the circuit 1226 has a structure including a resistance element 1246 and a different amplifier 1247. However, a structure of the circuit 1226 is not limited to the above structure, and any structure may be employed.

Subsequently, operation of reading data by electric action in a memory element that has an active matrix structure will be described. Reading data is performed by utilizing electric characteristics of the memory element 1215*b*, which are different between a memory cell with data "0" and a memory cell with data "1". For example, a reading method by utilizing the difference in electric resistance will be described, in the case where electric resistance of the memory element included in the memory cell with data "0" is R0 at a reading voltage, and electric resistance of the memory element included in the memory cell with data "1" is R1 at a reading voltage (R1<<R0). As for a reading/writing circuit, for example, the circuit 1226 using the resistance element 1246 and the different amplifier 1247 shown in FIG. 21B is conceivable as a structure of its reading portion. The resistance element has a resistance value of Rr (R1<Rr<R0). A transistor 1249 may be used instead of the resistance element 1246 and a clocked inverter 1248 can be used instead of the different amplifier (FIG. 21C). Naturally, a circuit structure is not limited to FIGS. 21A to 21C.

In the case of reading data from the memory cell 1231 in the x-th row and the y-th column, the memory cell 1231 is selected first by the decoders 1223 and 1224 and the selector 1225. Concretely, a predetermined voltage V24 is applied to a word line Wy connected to the memory cell 1231 by the decoder 1224 to turn on a transistor 1210*a*. In addition, a bit line Bx connected to the memory cell 1231 is connected to a terminal P of the circuit 1226 by the decoder 1223 and the selector 1225. As a result, the electric potential Vp of the terminal P is a value determined by resistance division of Vcom and V0 by the resistance element 1246 (resistance value: Rr) and the memory element 1215*b* (resistance value: R0 or R1). Therefore, the equation Vp0=Vcom+(V0−Vcom)×R0/(R0+Rr) is made in the case where the memory cell 1231 has data "0". Alternatively, the equation Vp1=Vcom+(V0−Vcom)×R1/(R1+Rr) is made in the case where the memory cell 1231 has data "1". As a result, by selecting Vref so as to be between Vp0 and Vp1 in FIG. 21B or by selecting the change point of the clocked inverter so as to be between Vp0 and Vp1 in FIG. 21C, Lo/Hi (or Hi/Lo) of output electric potential Vout is outputted in accordance with data "0"/"1" so that reading can be performed.

For example, the differential amplifier is operated at Vdd is 3 V, and Vcom, V0, and Vref are 0 V, 3 V, and 1.5 V, respectively. On the condition that the equation R0/Rr=Rr/R1=9 holds and on-resistance of the transistor 1210*a* can be ignored, Hi is outputted as Vout at Vp0=2.7 V when a memory cell has data "0", or Lo is outputted as Vout at Vp1=0.3 V when a memory cell has data "1". In this way, reading from a memory cell can be performed.

In accordance with the above method, reading is performed by a voltage value utilizing the difference in a resistance value of the memory element 1215*b* and resistance division. Naturally, the reading method is not limited thereto. For example, reading may be performed by utilizing the difference in current values other than the method utilizing the difference in electric resistance. In the case where electric characteristics of the memory cell have different diode characteristics in threshold voltages in the case of data "0" and data "1", reading may be performed by utilizing difference in the threshold voltages.

A memory element and a memory device including the memory element, which have the above structure are a nonvolatile memory; therefore, an electric battery for storing data is not required to be incorporated, and a small-sized, thin, and lightweight memory device and a semiconductor device thereof can be provided. Further, by using the insulating material used in the above embodiment modes as an insulating layer, data cannot be rewritten though data can be written (additionally). Accordingly, counterfeits can be prevented and a memory device and a semiconductor device with ensured security can be provided.

It is to be noted that the present embodiment mode can be performed freely by combining the memory element, and the structure of the memory device and the semiconductor device, which include the memory element shown in the above embodiment mode.

The invention claimed is:

1. A semiconductor device comprising a memory element, the memory element comprising:
   a first conductive layer;
   a liquid-repellent layer over the first conductive layer;
   an insulating layer over the first conductive layer and the liquid-repellent layer; and
   a second conductive layer over the insulating layer;
   wherein the insulating layer is changeable from a solid state to a fluidized state when a voltage is applied between the first conductive layer and the second conductive layer; and
   wherein a wettability of the liquid-repellent layer with respect to the insulating layer being in the fluidized state is lower than that of the first conductive layer.

2. A semiconductor device comprising a memory element, the memory element comprising:
   a first conductive layer,
   a liquid-repellent layer over a part of the first conductive layer;
   an insulating layer over the first conductive layer and the liquid-repellent layer; and
   a second conductive layer over the insulating layer;
   wherein the insulating layer is changeable from a solid state to a fluidized state when a voltage is applied between the first conductive layer and the second conductive layer; and
   wherein a wettability of the liquid-repellent layer with respect to the insulating layer being in the fluidized state is lower than that of the first conductive layer.

3. A semiconductor device comprising a memory element, the memory element comprising:
   a first conductive layer;
   a liquid-repellent layer over and in contact with the first conductive layer;
   an insulating layer over the first conductive layer and the liquid-repellent layer; and
   a second conductive layer over the insulating layer;
   wherein the insulating layer is changeable from a solid state to a fluidized state when a voltage is applied between the first conductive layer and the second conductive layer; and
   wherein a wettability of the liquid-repellent layer with respect to the insulating layer being in the fluidized state is lower than that of the first conductive layer, and wherein an area of the liquid-repellent layer is smaller than that of the first conductive layer.

4. A semiconductor device according to any one of claims 1 to 3, further comprising a partition wall which covers an end portion of the first conductive layer.

5. A semiconductor device according to any one of claims 1 to 3, wherein the liquid-repellent layer includes a substance containing a fluorocarbon group.

6. A semiconductor device according to any one of claims 1 to 3, wherein the liquid-repellent layer includes a substance including a silane coupling agent.

7. A semiconductor device according to claim 6, wherein the silane coupling agent includes an alkyl group.

8. A semiconductor device comprising a memory element, the memory element comprising:
   a first conductive layer;
   a monomolecular film over the first conductive layer;
   an insulating layer over the first conductive layer and the monomolecular film; and
   a second conductive layer over the insulating layer;
   wherein the insulating layer is changeable from a solid state to a fluidized state when a voltage is applied between the first conductive layer and the second conductive layer; and
   wherein a wettability of the monomolecular film with respect to the insulating layer being in the fluidized state is lower than that of the first conductive layer.

9. A semiconductor device comprising a memory element, the memory element comprising:
   a first conductive layer;
   a monomolecular film over a part of the first conductive layer;
   an insulating layer over the first conductive layer and the monomolecular film; and
   a second conductive layer over the insulating layer;
   wherein the insulating layer is changeable from a solid state to a fluidized state when a voltage is applied between the first conductive layer and the second conductive layer; and
   wherein a wettability of the monomolecular film with respect to the insulating layer being in the fluidized state is lower than that of the first conductive layer.

10. A semiconductor device comprising a memory element, the memory element comprising:
    a first conductive layer;
    a monomolecular film over and in contact with the first conductive layer;
    an insulating layer over the first conductive layer and the monomolecular film; and
    a second conductive layer over the insulating layer;
    wherein the insulating layer is changeable from a solid state to a fluidized state when a voltage is applied between the first conductive layer and the second conductive layer; and
    wherein a wettability of the monomolecular film with respect to the insulating layer being in the fluidized state is lower than that of the first conductive layer, and
    wherein an area of the monomolecular film is smaller than that of the first conductive layer.

11. A semiconductor device according to any one of claims 8 to 10, further comprising a partition wall which covers an end portion of the first conductive layer.

12. A semiconductor device according to any one of claims 8 to 10, wherein the monomolecular film is a silane coupling agent.

13. A semiconductor device according to any one of claims 1 to 3 and 8 to 10, wherein the insulating layer includes an organic material.

* * * * *